United States Patent
Hong et al.

(10) Patent No.: US 12,317,736 B2
(45) Date of Patent: *May 27, 2025

(54) STRETCHABLE DISPLAY

(71) Applicant: KOREA UNIVERSITY RESEARCH AND BUSINESS FOUNDATION, SEJONG CAMPUS, Sejong-si (KR)

(72) Inventors: Mun Pyo Hong, Seongnam-si (KR); Sang Il Kim, Yongin-si (KR); Jeong Hyun Kim, Seoul (KR)

(73) Assignee: KOREA UNIVERSITY RESEARCH AND BUSINESS FOUNDATION, SEJONG CAMPUS, Sejong-si (KR)

( * ) Notice: Subject to any disclaimer, the term of this patent is extended or adjusted under 35 U.S.C. 154(b) by 616 days.

This patent is subject to a terminal disclaimer.

(21) Appl. No.: 17/352,872

(22) Filed: Jun. 21, 2021

(65) Prior Publication Data

US 2021/0313527 A1 Oct. 7, 2021

Related U.S. Application Data

(63) Continuation of application No. PCT/KR2019/018170, filed on Dec. 20, 2019.

(30) Foreign Application Priority Data

Dec. 20, 2018 (KR) .................. 10-2018-0166261
Nov. 20, 2019 (KR) .................. 10-2019-0149311

(51) Int. Cl.
*H10K 77/10* (2023.01)
*H10K 59/131* (2023.01)
(Continued)

(52) U.S. Cl.
CPC ......... *H10K 77/111* (2023.02); *H10K 59/131* (2023.02); *H10K 59/351* (2023.02); *H10K 59/353* (2023.02); *H10K 2102/311* (2023.02)

(58) Field of Classification Search
CPC .... H05K 1/0283; H10K 99/00; H10K 77/111; H10K 2102/311; H10K 59/1201;
(Continued)

(56) References Cited

U.S. PATENT DOCUMENTS

| | | | | |
|---|---|---|---|---|
| 2,083,973 | A | * | 6/1937 | Zimmerman ........... A47F 5/112 211/49.1 |
| 2011/0171768 | A1 | * | 7/2011 | Hong ................... C23C 14/042 257/E33.001 |

(Continued)

FOREIGN PATENT DOCUMENTS

| KR | 10-2015-0138913 A | 12/2015 |
|---|---|---|
| KR | 10-2016-0020034 A | 2/2016 |

(Continued)

OTHER PUBLICATIONS

International Search Report for PCT/KR2019/018170, dated May 28, 2020.

*Primary Examiner* — Ratisha Mehta
(74) *Attorney, Agent, or Firm* — Sughrue Mion, PLLC

(57) ABSTRACT

Provided is a stretchable display partitioned into a high-stretchable region and a low-stretchable region having a modulus higher than a modulus of the high-stretchable region, in which the low-stretchable region has a shape of a plurality of islands spaced apart from each other, and the high-stretchable region includes: a stretchable substrate surrounding the island-shaped low-stretchable region; and a plurality of pixel portions provided in each island-shaped low-stretchable region, and including a light emitting layer for emitting a specific color and a driving device for controlling a driving of the light emitting layer.

7 Claims, 31 Drawing Sheets

(51) Int. Cl.
*H10K 59/35* (2023.01)
*H10K 102/00* (2023.01)

(58) Field of Classification Search
CPC ...... H10K 59/131; H10K 71/00; H10K 71/80; H10K 59/12; H10K 59/1213; H10K 2101/00; H10K 50/844; H10K 59/00; H10K 59/123; H10K 59/351; H10K 59/353
See application file for complete search history.

(56) References Cited

U.S. PATENT DOCUMENTS

| | | | |
|---|---|---|---|
| 2016/0202483 A1* | 7/2016 | Seo | G02B 27/017 |
| | | | 359/630 |
| 2016/0293571 A1* | 10/2016 | Yoon | H10K 77/111 |
| 2016/0320878 A1 | 11/2016 | Hong et al. | |
| 2016/0336537 A1* | 11/2016 | Tsuruoka | H01L 27/1218 |
| 2018/0046221 A1* | 2/2018 | Choi | H05B 33/22 |
| 2018/0090700 A1* | 3/2018 | Nishinohara | H10K 59/131 |

FOREIGN PATENT DOCUMENTS

| | | |
|---|---|---|
| KR | 10-1680443 B1 | 11/2016 |
| KR | 10-1720647 B1 | 3/2017 |
| KR | 10-1768675 B1 | 8/2017 |
| KR | 10-2018-0094210 A | 8/2018 |
| WO | 2018/230940 A1 | 12/2018 |

* cited by examiner

[Fig. 1]
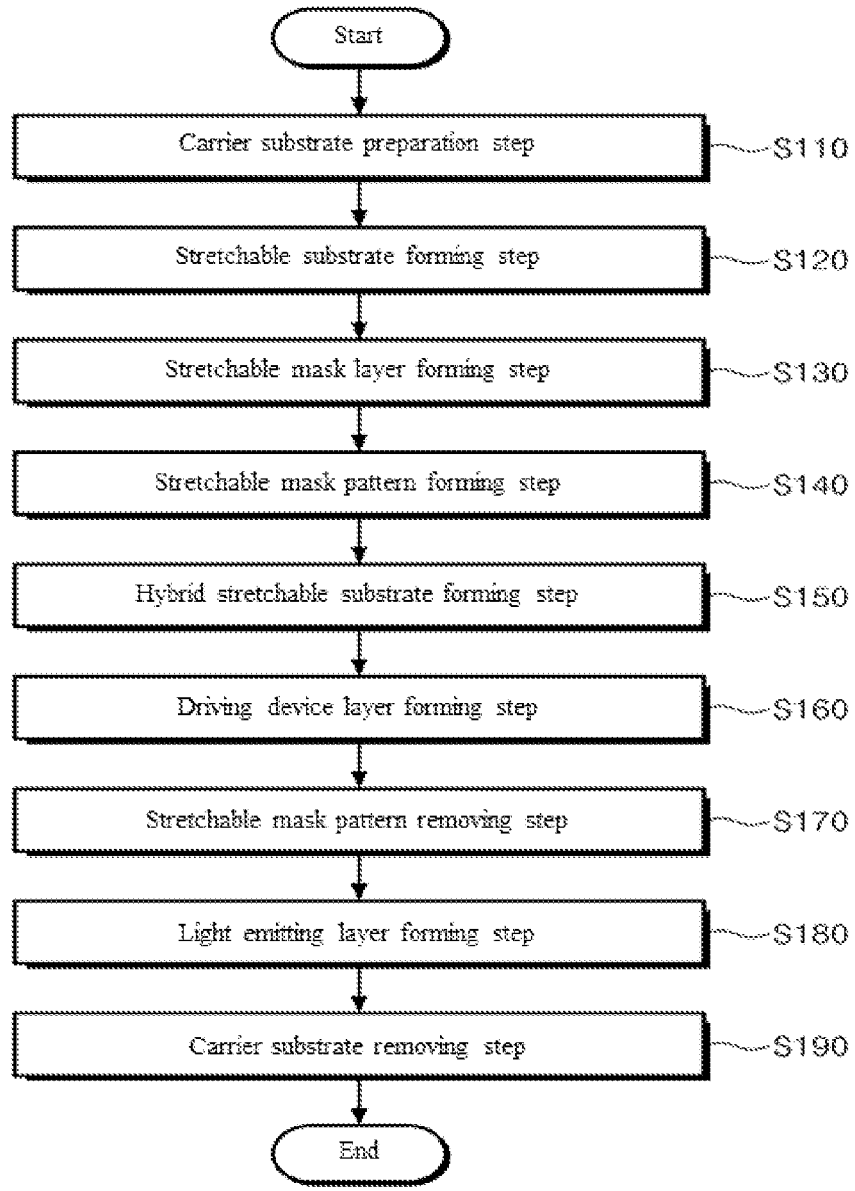

[Fig. 2A]
S110 & S120
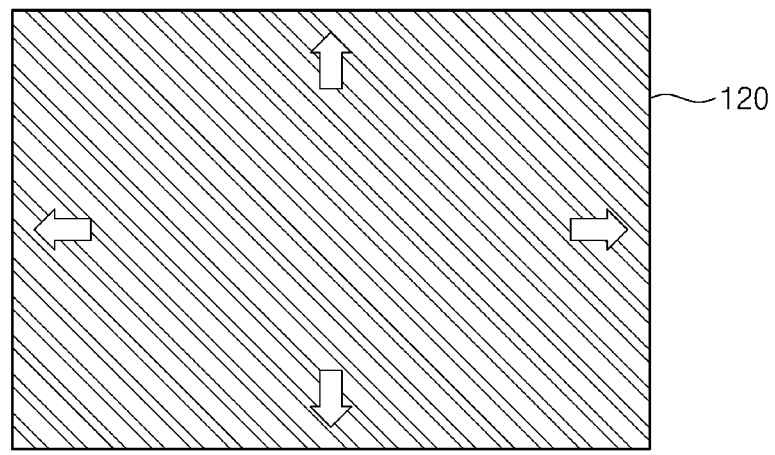
[Fig. 2B]
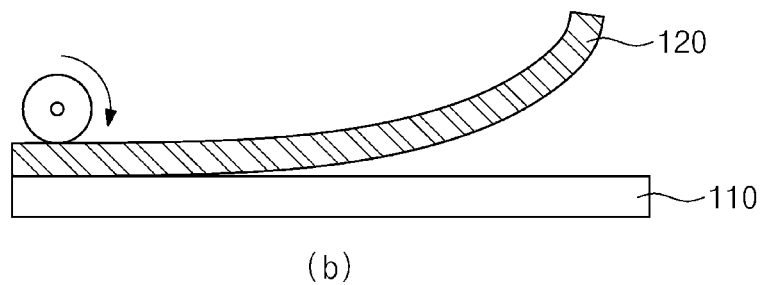
(b)

[Fig. 3]
S130
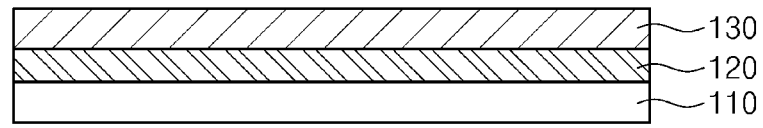

【Fig. 4A】
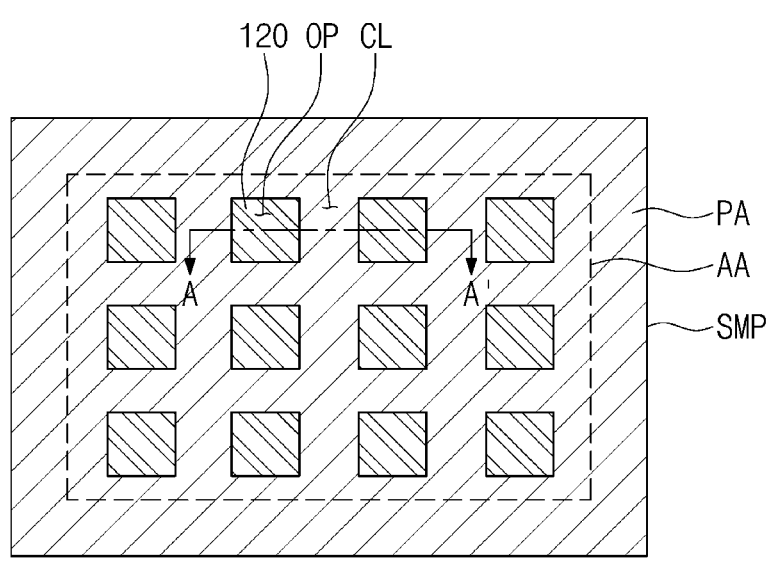
【Fig. 4B】
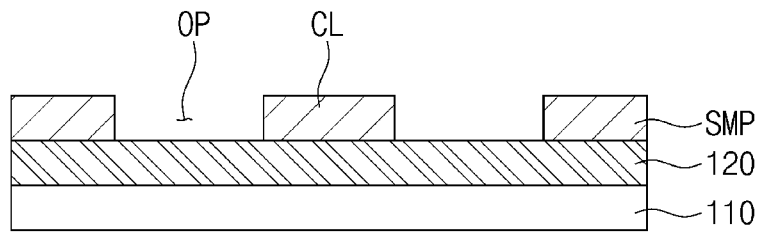

[Fig. 5A]
S150
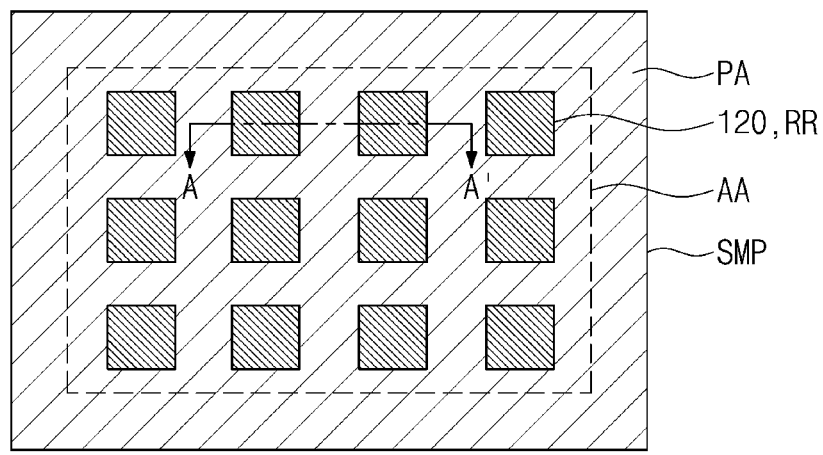
[Fig. 5B]
A-A'
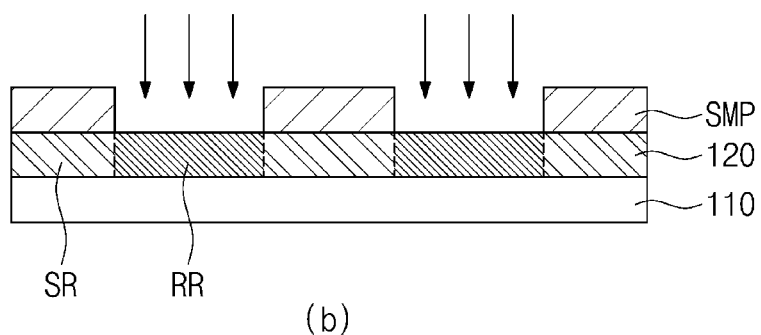
(b)

[Fig. 6A]
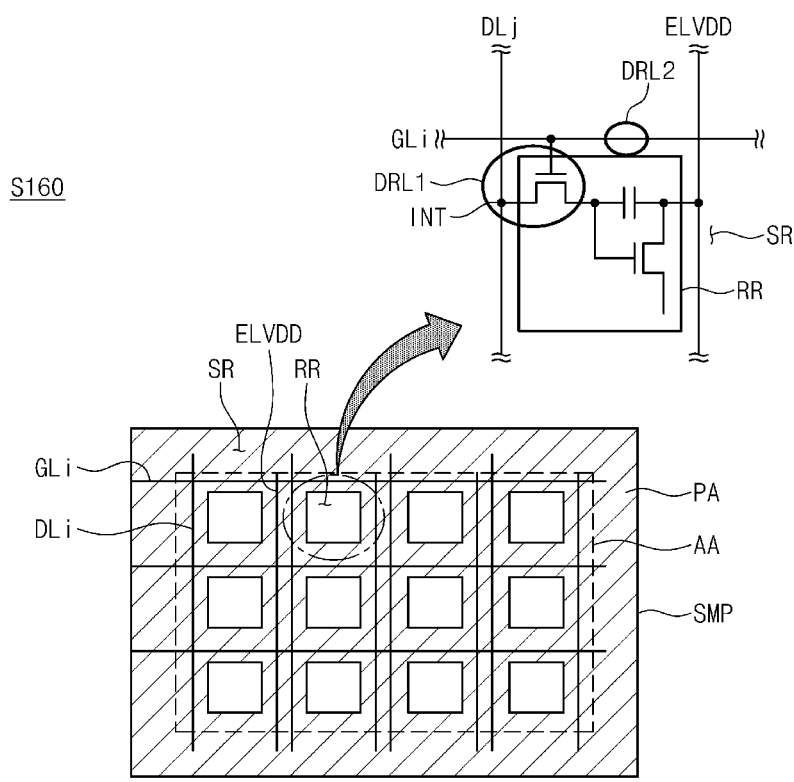

[Fig. 6B]
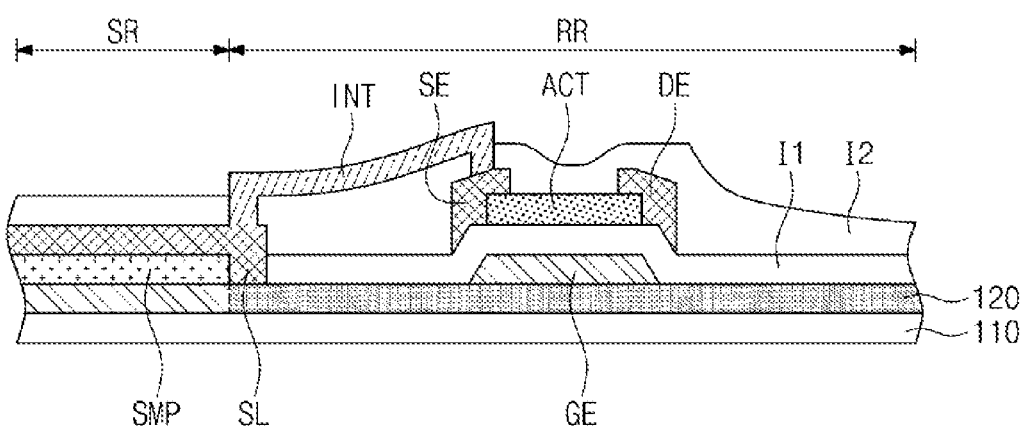
[Fig. 6C]
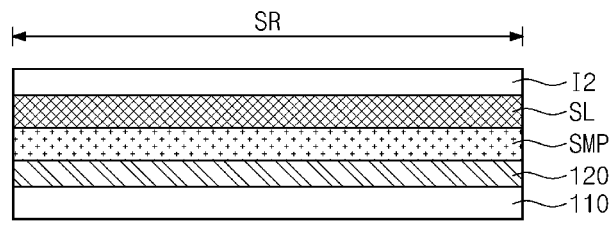

[Fig. 6B]
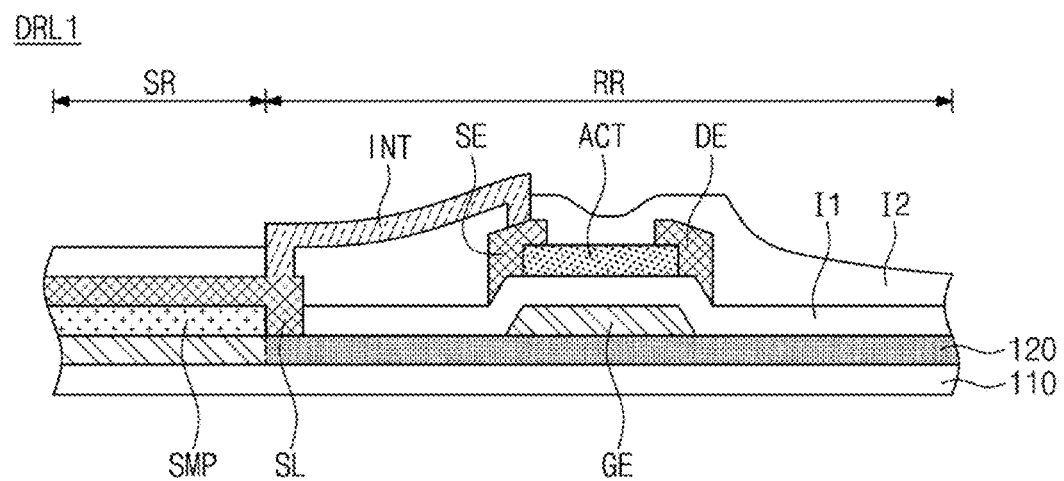

【Fig. 7A】
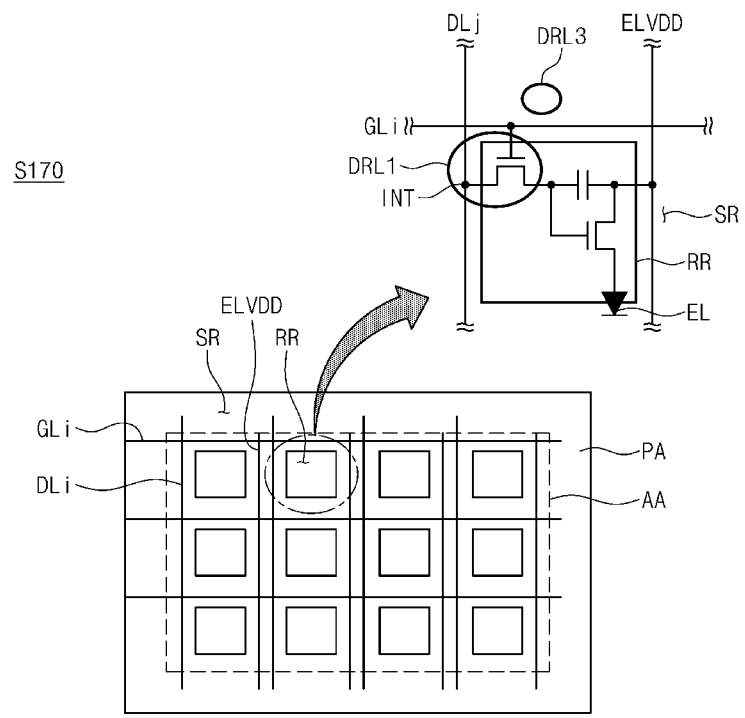
【Fig. 7B】
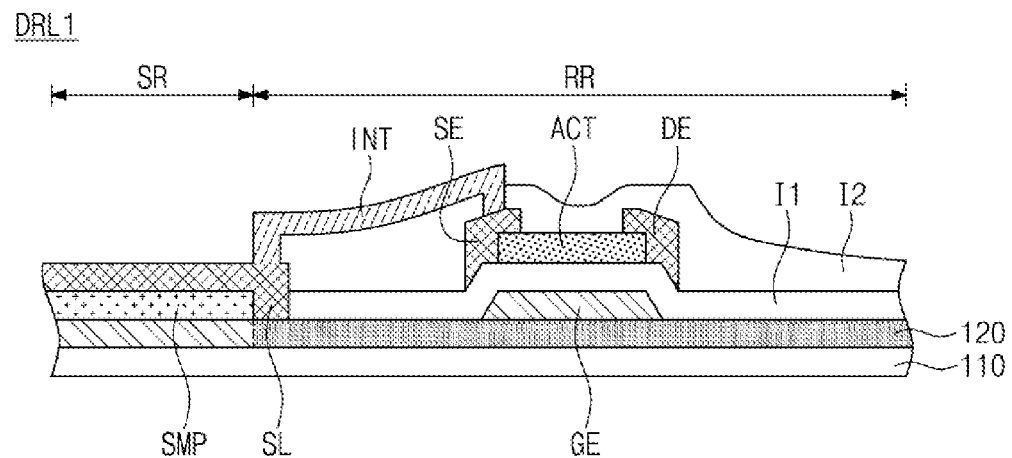

[Fig. 7C]
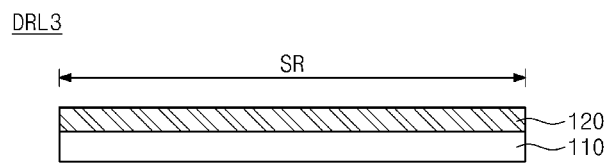

[Fig. 8A]
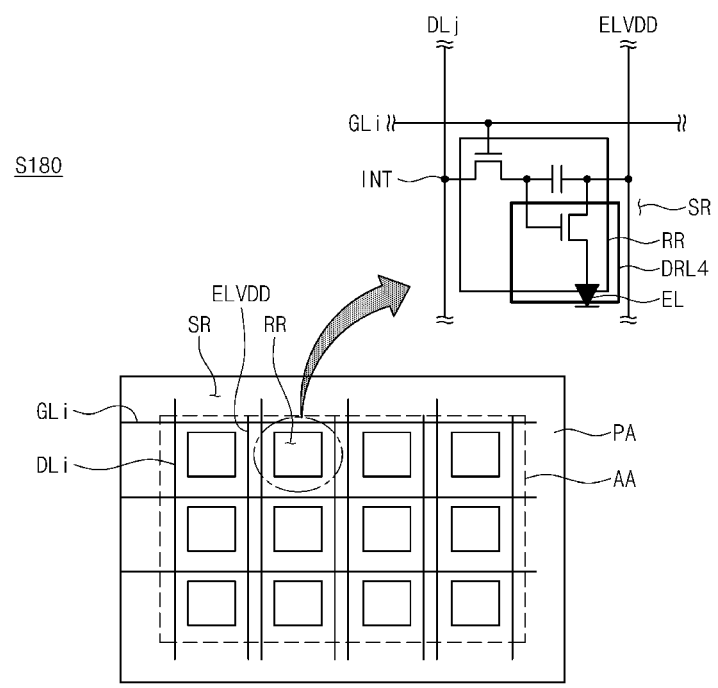

[Fig. 8B]
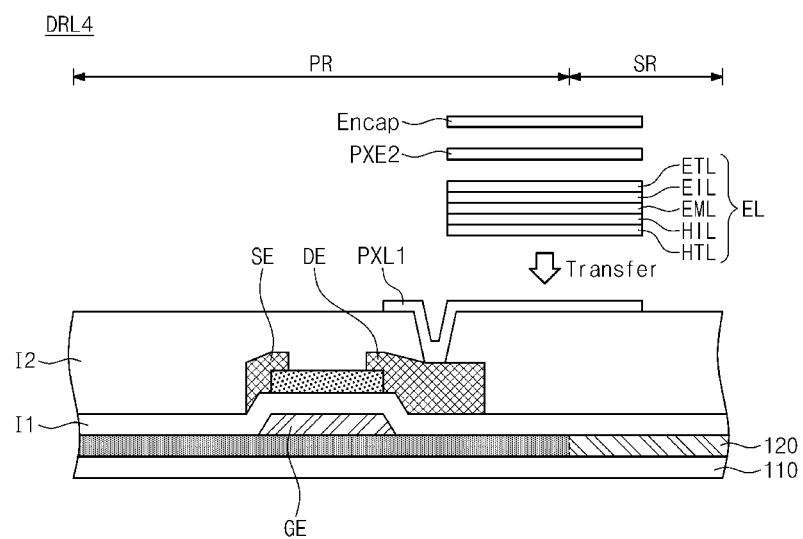

[Fig. 9A]
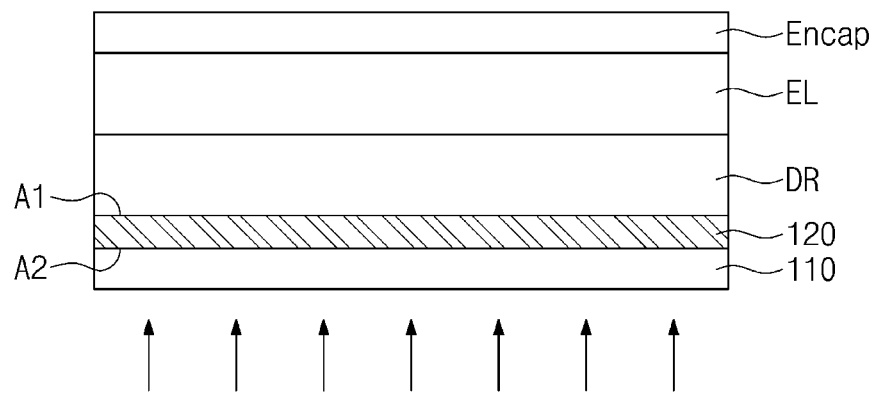
[Fig. 9B]
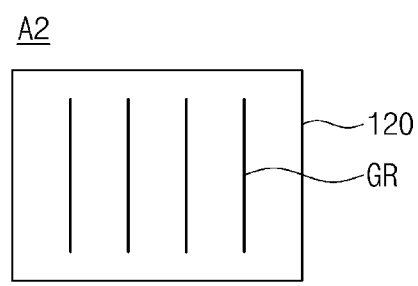
[Fig. 9C]
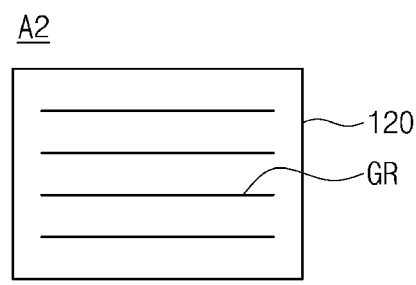

[Fig. 9D]
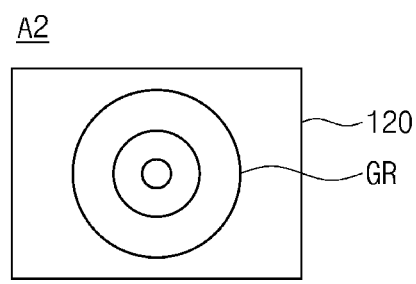

[Fig. 10]
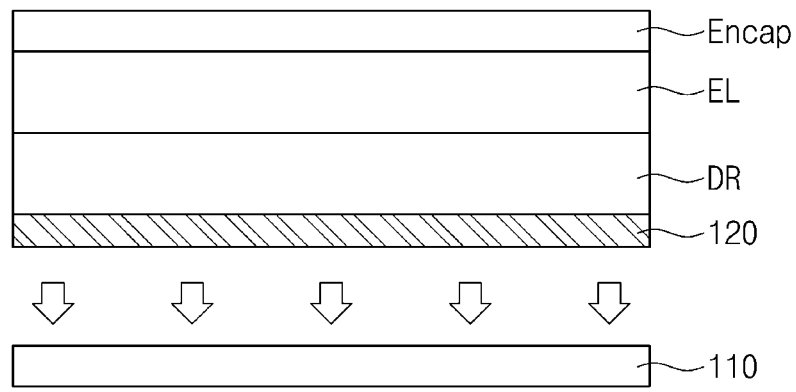

【Fig. 11A】
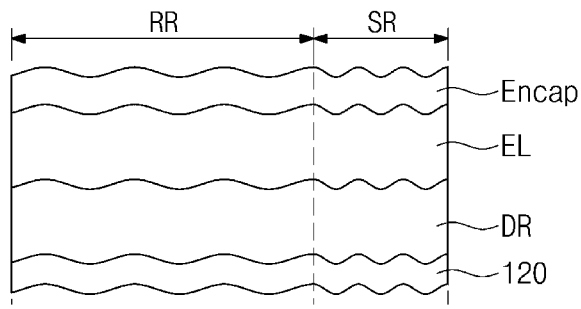
【Fig. 11B】
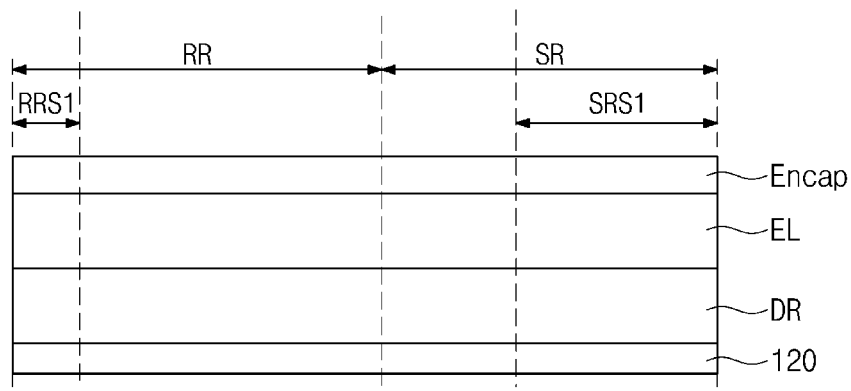
【Fig. 11C】
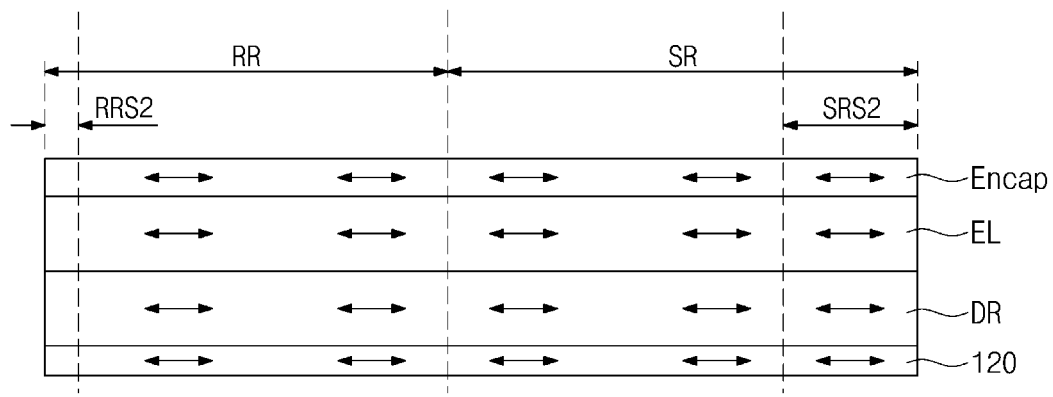

[Fig. 12]
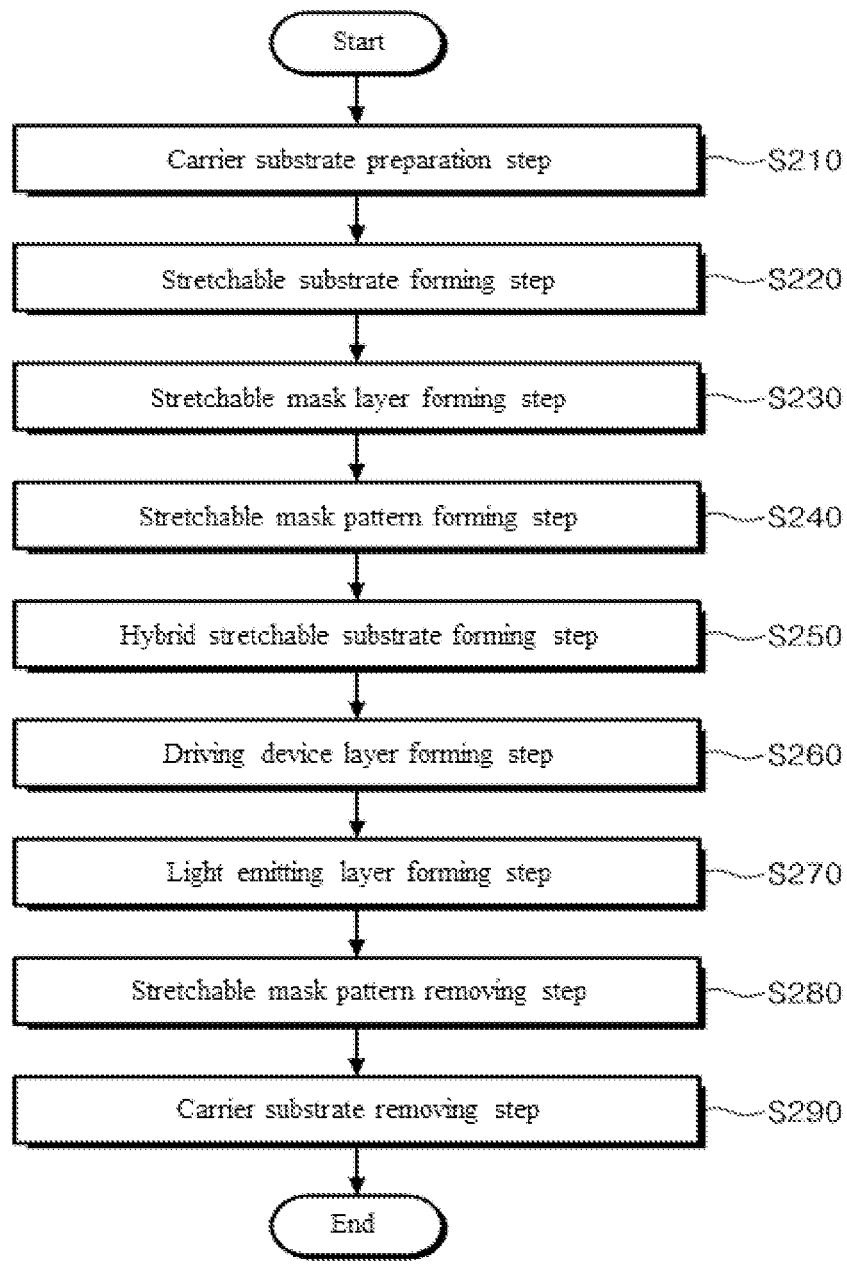

【Fig. 13A】
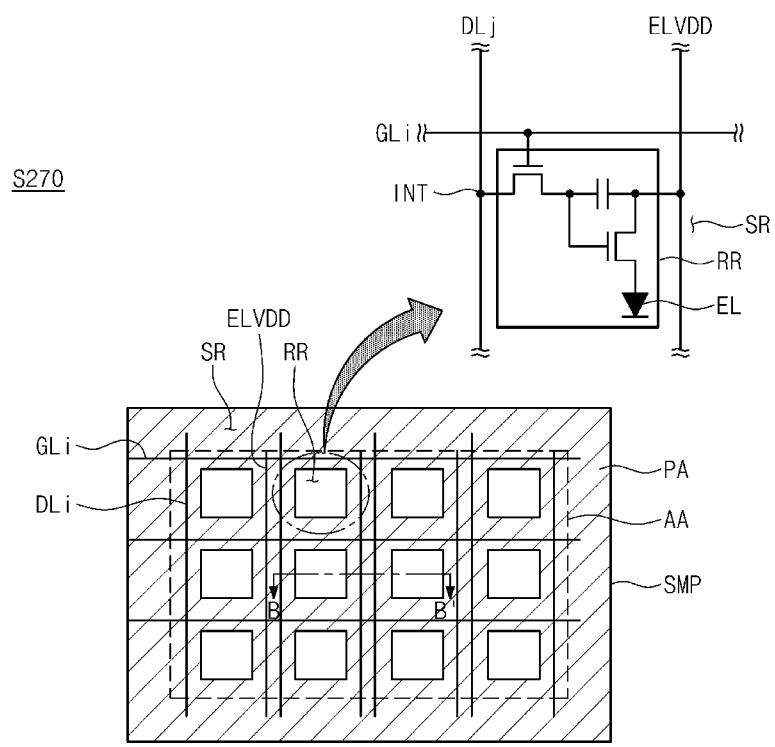

[Fig. 13B]
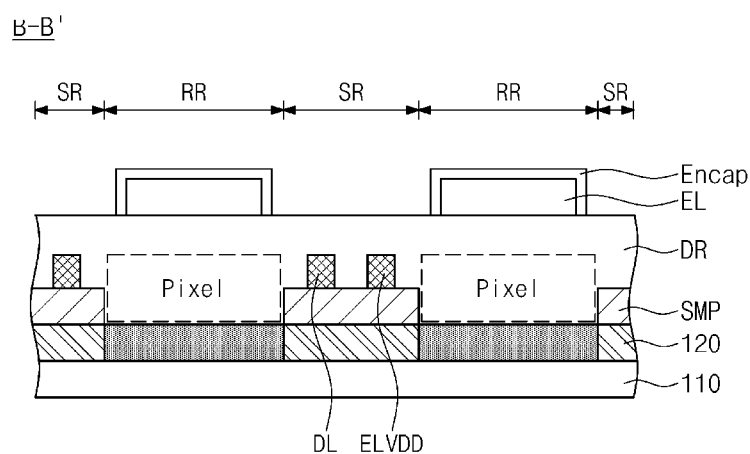

[Fig. 14A]
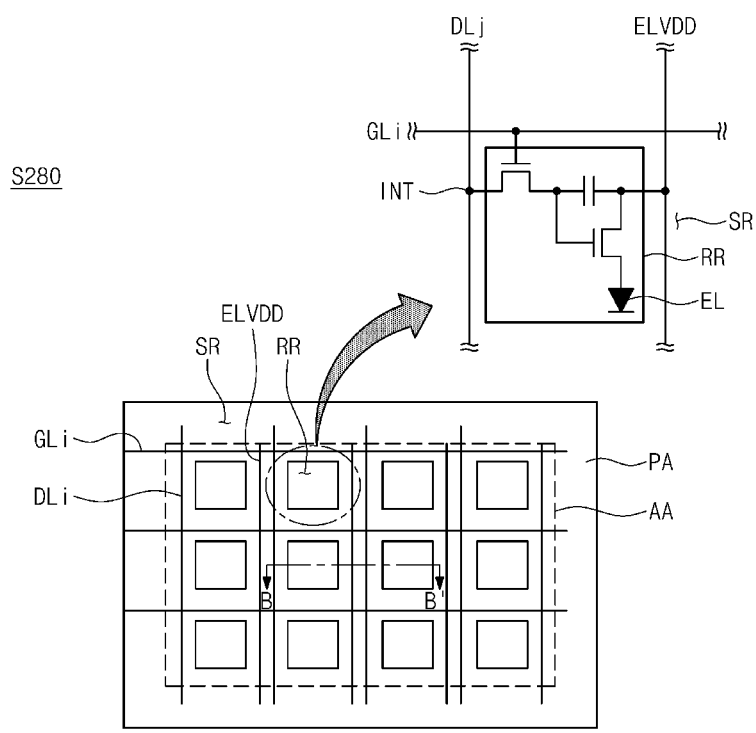

[Fig. 14B]
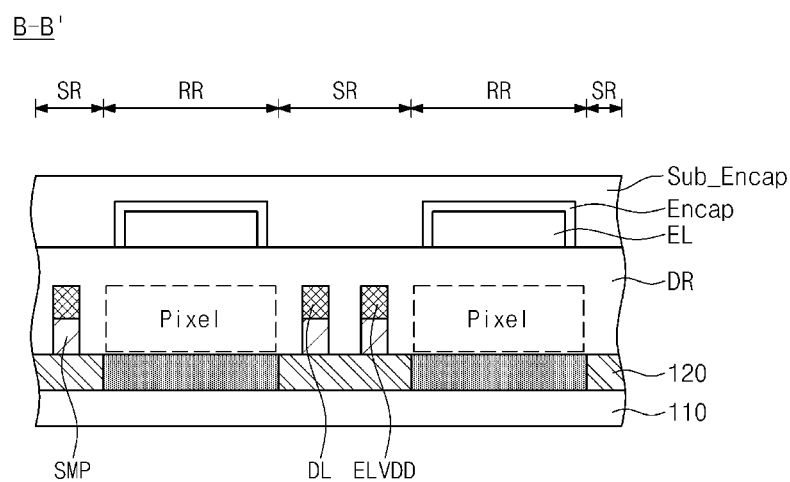

[Fig. 15]
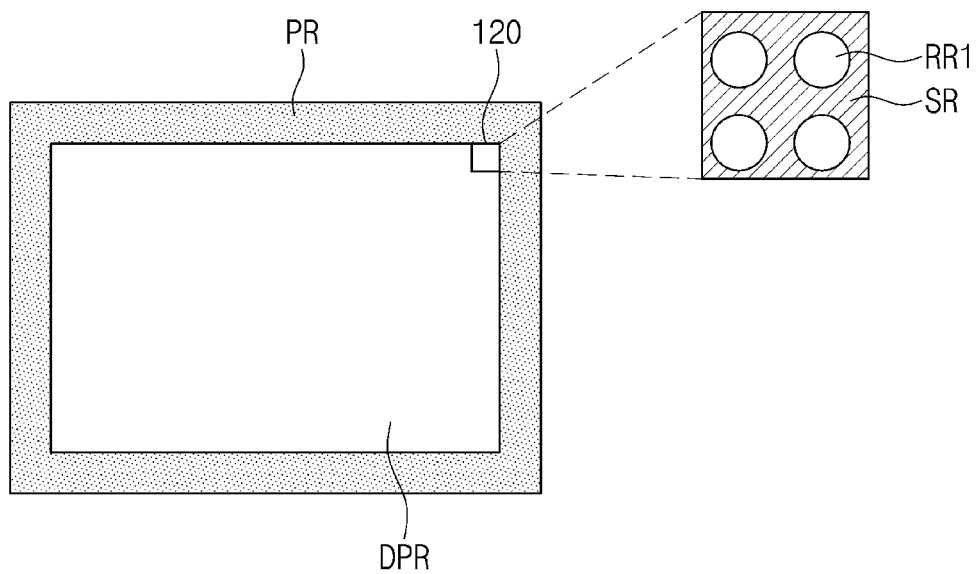

[Fig. 16]
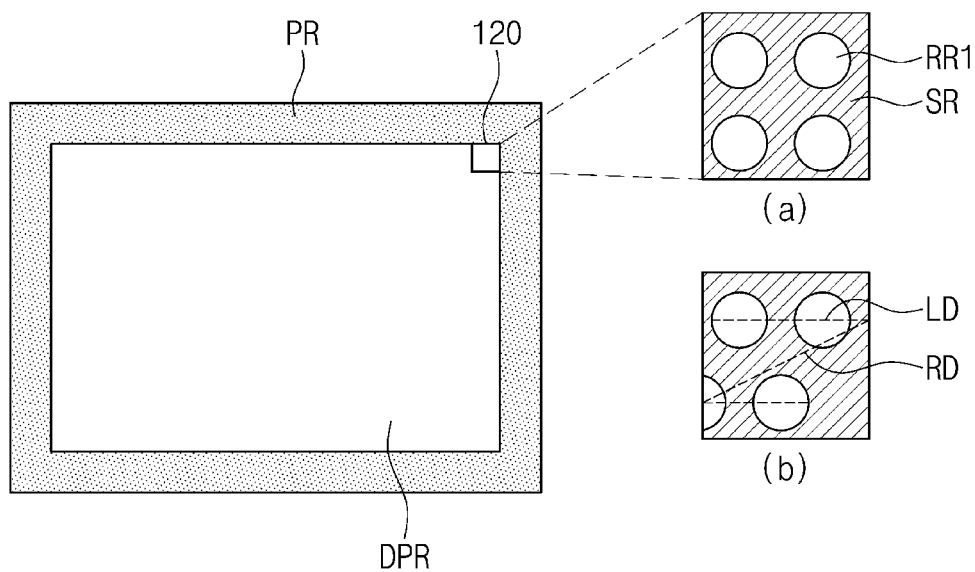

【Fig. 17】
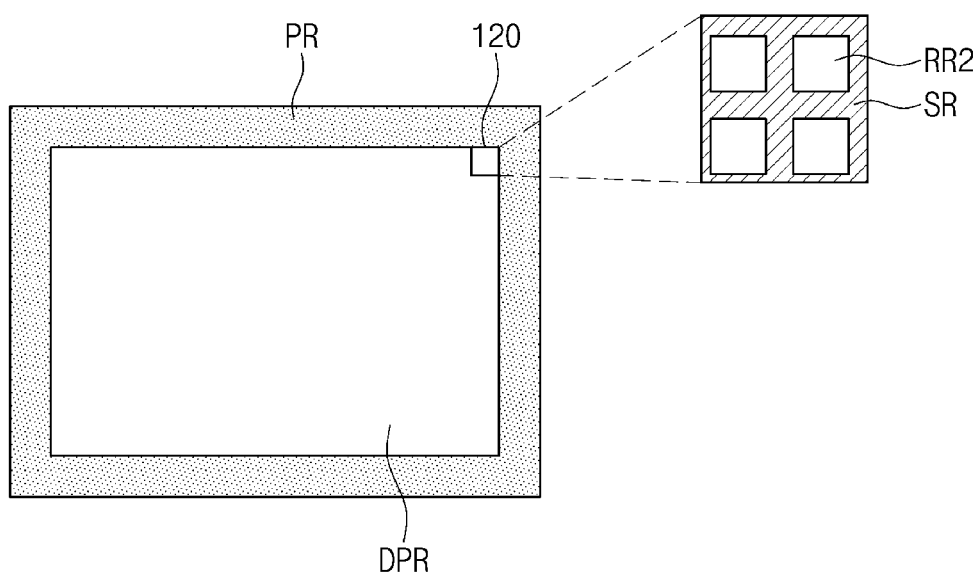

[Fig. 18]
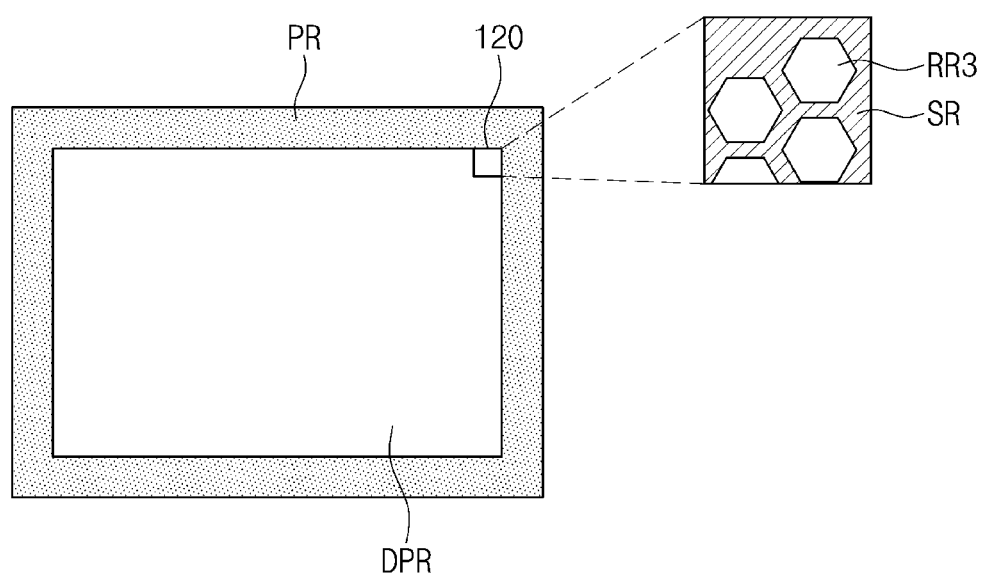

[Fig. 19]
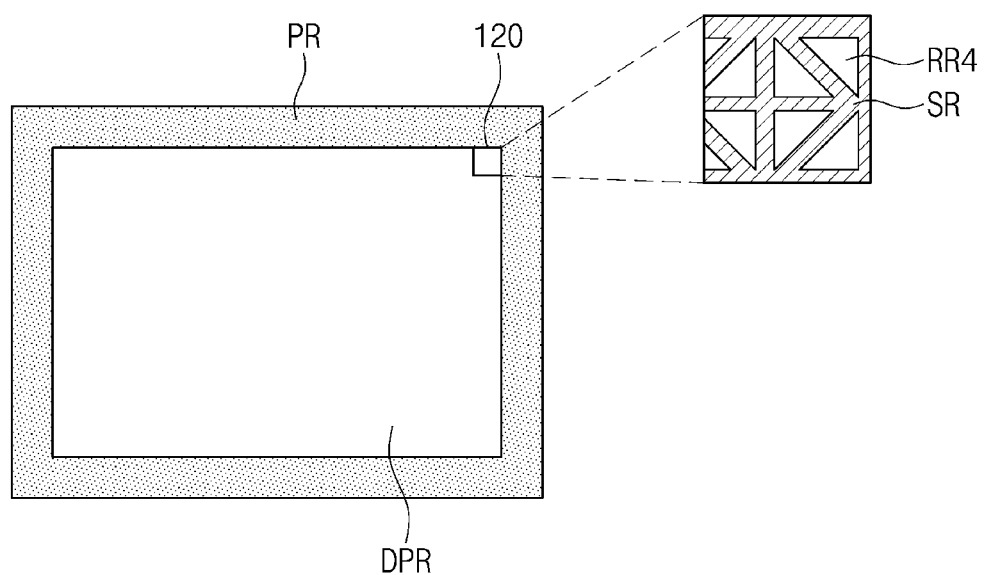

[Fig. 20]
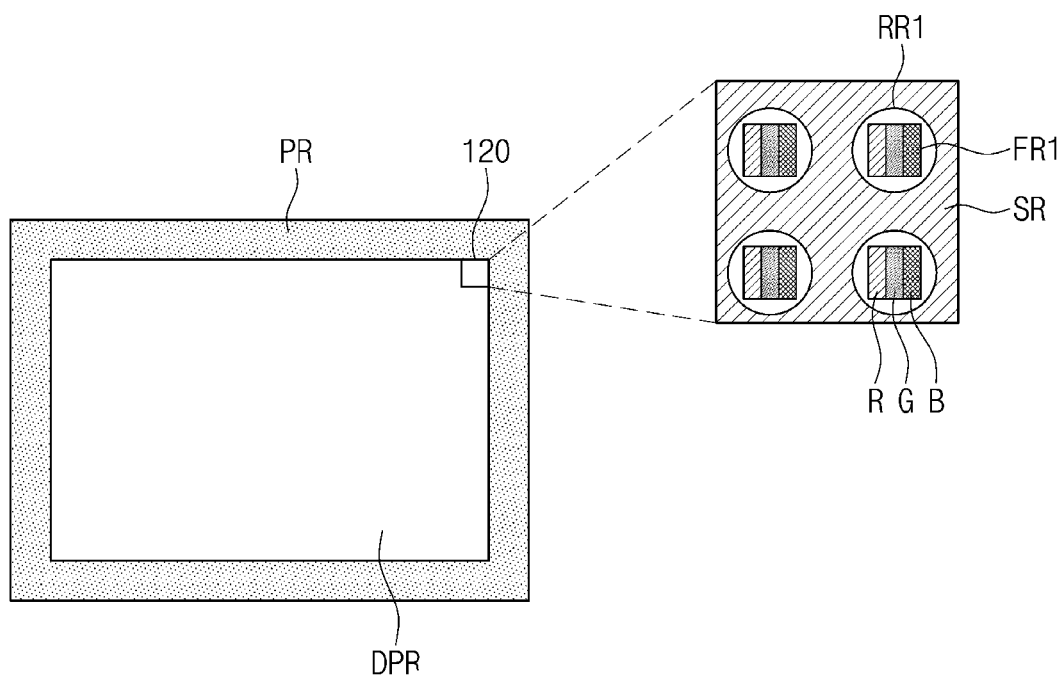

【Fig. 21】
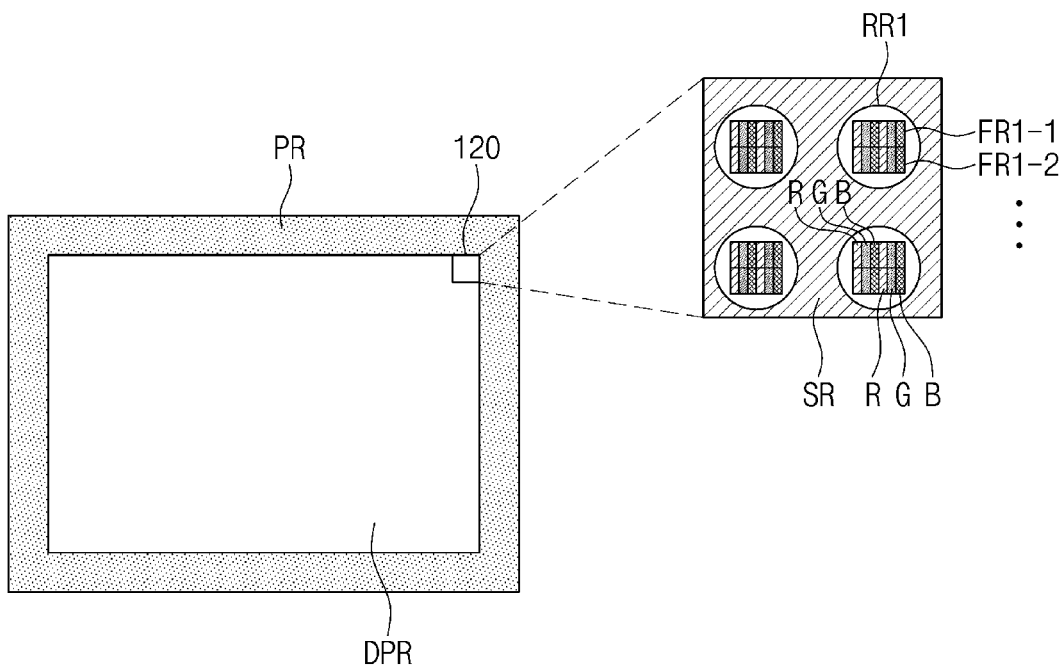

[Fig. 22]
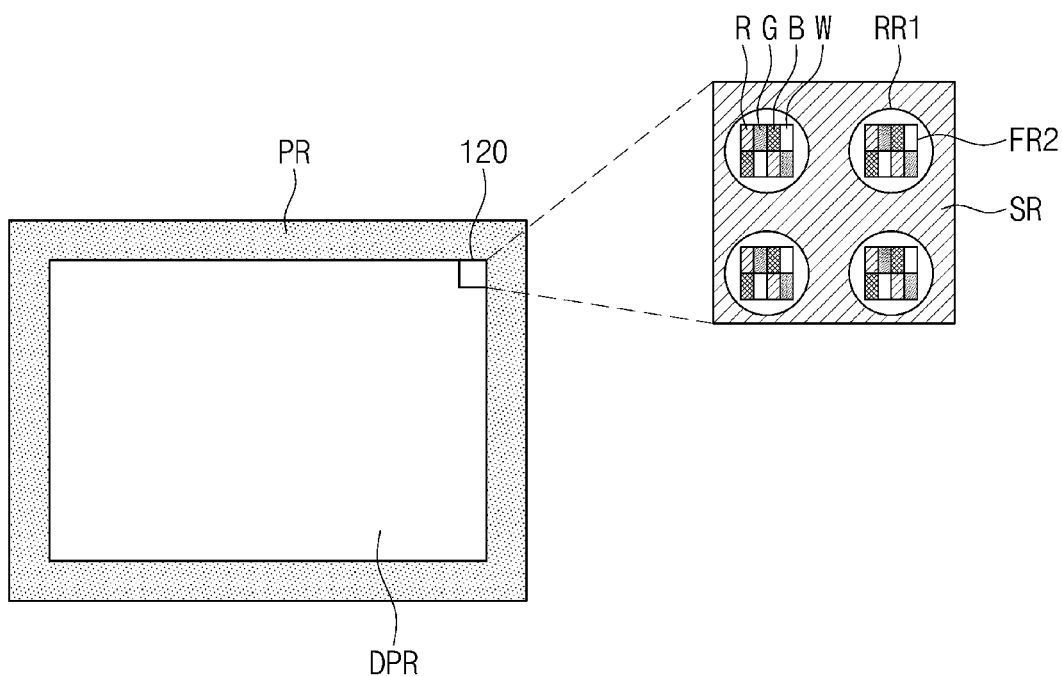

[Fig. 23]
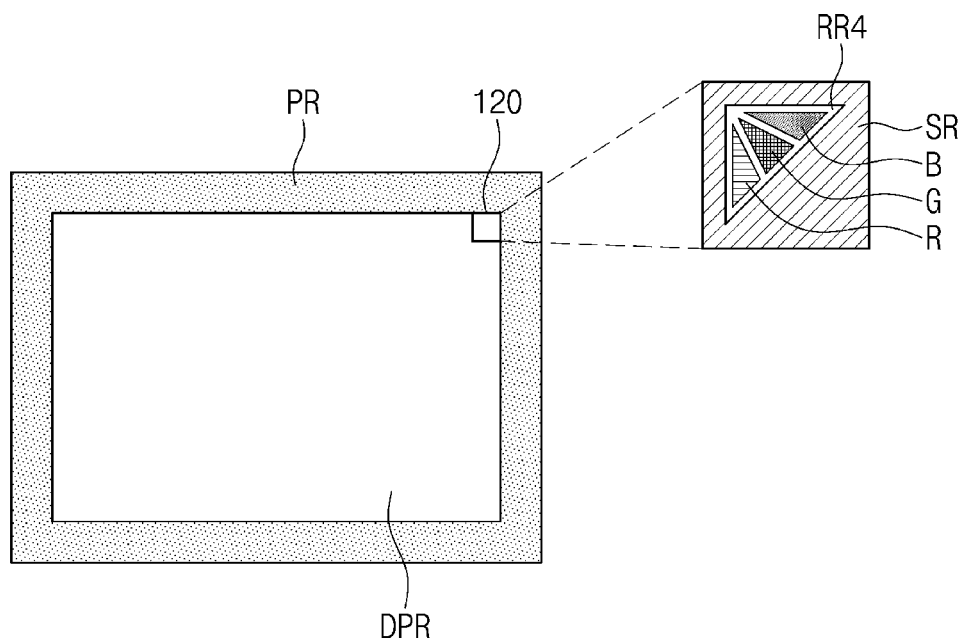

[Fig. 24]
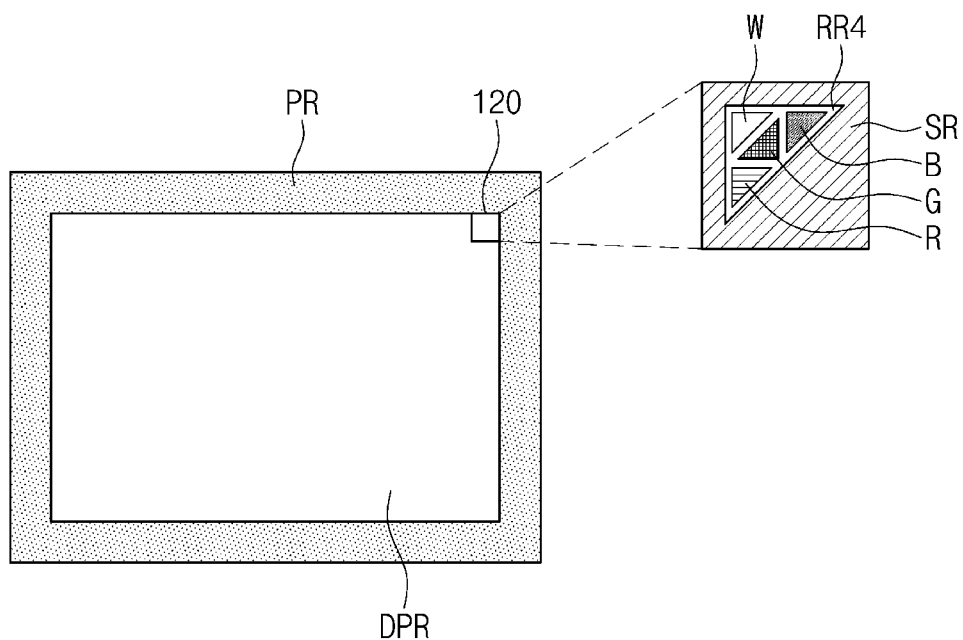

STRETCHABLE DISPLAY

TECHNICAL FIELD

The present invention relates to a stretchable display, and more particularly, to a stretchable display provided with a stretchable substrate including a low stretchable region having a plurality of island shapes spaced apart from each other, and a high stretchable region relatively more stretchable than the low stretchable region.

BACKGROUND ART

A traditional display simply refers to a device that outputs an electrical signal in a visual form. However, recent displays are not only developed as devices for displaying information, but also are developing into a form that has stretchable properties as well.

The stretchable display has evolved to a bendable stage that can be curved and bent in a predetermined range, a rollable stage that can be rolled like a scroll, and a foldable stage that can be folded like paper. However, more recent displays continue to evolve into a stretchable stage that can be scaled up and down in one or two axes.

In particular, the stretchable displays are attracting attention in satisfying market characteristics that require elasticity, such as wearable devices.

However, various technical problems are required to be solved in order to manufacture the stretchable display. When the conventional stretchable display process is applied to the stretchable display process, it is difficult to retain elasticity because the conventional stretchable display polymer substrate is thick. In other words, since the thickness is required to be thinner in order to allow the substrate to have the elasticity, there is a limit to applying the conventional stretchable display manufacturing process to the stretchable display manufacturing process.

Meanwhile, a hybrid type stretchable stretchable display is being developed to have a low-stretchable region disposed with a low-stretch device and a high-stretchable region disposed with a highly stretchable device. In general, since the size of a single pixel is merely several tens of microns, the high-stretchable region and the low-stretchable region are also required to be patterned in unit of at least several tens of microns. However, the stretchable substrate structure and the stretchable display to be patterned in the unit of several tens of microns or less have not been developed so far.

In addition, it is insufficient in a technology of arranging pixels in a low-stretchable region partitioned on the stretchable substrate of the stretchable display so as to form the low-stretchable region in various shapes to arrange a plurality of pixels, and a technology of arranging the pixels in the low-stretchable region in various ways.

Thus, the present inventors have invented a technology of implementing pixel unit patterning in a simple way, preventing a damage to a stretchable substrate, and forming a low-stretchable region of the stretchable substrate in various shapes, and a technology of arranging a plurality of pixels the low-stretchable region in various ways.

DISCLOSURE

Technical Problem

One technical problem to be solved by the present invention is to provide a stretchable substrate structure and a manufacturing method thereof, and a stretchable display and a manufacturing method thereof so as to fine pattern a high-stretchable region and a low-stretchable region.

Another technical problem to be solved by the present invention is to provide a stretchable display and a manufacturing method thereof so as to minimize a damage to a stretchable substrate.

Still another technical problem to be solved by the present invention is to provide a stretchable substrate structure and a manufacturing method thereof, and a stretchable display and a manufacturing method thereof, and a using method of the stretchable display so as to have high elasticity.

Still another technical problem to be solved by the present invention is to provide a stretchable substrate structure and a manufacturing method thereof, and a stretchable display and a manufacturing method thereof so as to have excellent economic feasibility.

Still another technical problem to be solved by the present invention is to provide a stretchable substrate structure and a manufacturing method thereof, and a stretchable display and a manufacturing method thereof so as to be easily processed.

Still another technical problem to be solved by the present invention is to provide a stretchable display and a manufacturing method thereof, and a using method of the stretchable display so as to have high elasticity while minimizing deterioration of image quality.

One technical problem to be solved by the present invention is to provide various island shapes of a low-stretchable region.

One technical problem to be solved by the present invention is to provide an arrangement of an island-shaped low-stretchable region.

One technical problem to be solved by the present invention is to provide a plurality of pixels arranged in an island-shaped low-stretchable region.

One technical problem to be solved by the present invention is to provide a low-stretchable region having an island shape formed in various shapes.

One technical problem to be solved by the present invention is to provide a plurality of pixels arranged in various arrangements within a low-stretchable regional.

The technical problems to be solved by the present invention are not limited to the above.

Technical Solution

In order to solve the above-mentioned technical problems, the present invention provides a stretchable display.

According to one embodiment, the stretchable display may include a stretchable substrate partitioned into a high-stretchable region and a low-stretchable region having a modulus higher than a modulus of the high-stretchable region, in which the low-stretchable region has a shape of a plurality of islands spaced apart from each other, the high-stretchable region surrounds the island-shaped low-stretchable region; and a plurality of pixel portions provided in each of the island-shaped low-stretchable regions, and including a light emitting layer for emitting a specific color and a driving device layer for controlling a driving of the light emitting layer.

According to one embodiment, the island shape of the low-stretchable region may be circular or polygonal.

According to one embodiment, the low-stretchable region is arranged with a plurality of rows and a plurality of columns in a plane direction of the stretchable substrate, in which the low-stretchable region may be arranged in a zigzag manner along the row direction or the column direction.

According to one embodiment, when the island shape of the low-stretchable region is the polygon, the low-stretchable region may be arranged so that adjacent hypotenuses of the polygons forming the low-stretchable region face each other.

According to one embodiment, when the island shape of the low-stretchable region is the triangle, the low-stretchable region may be arranged so that adjacent hypotenuses of the triangles forming the low-stretchable region face each other.

According to one embodiment, the pixel portions arranged in each island-shaped low-stretchable region may include a combination of red (R), green (G), and blue (B) or a combination of red (R), green (G), blue (B), and white (W).

According to one embodiment, each of the pixel portions arranged in each island-shaped low-stretchable region may have a shape corresponding to the island shape of the low-stretchable region, or the pixel portions arranged in each island-shaped low-stretchable region may be arranged in an arrangement corresponding to the island shape of the low-stretchable region.

According to one embodiment, the stretchable substrate may have wrinkles, and the low-stretchable region may have fewer wrinkles than the high-stretchable region.

According to one embodiment, the stretchable display may further include a stretchable mask pattern partitioning the low-stretchable region and the high-stretchable region and provided on any one of the low-stretchable region and the high-stretchable region.

According to one embodiment, the driving device layer may include a driving device formed on the low-stretchable region to control the light emitting layer, and a wiring formed on the high-stretchable region and electrically connected to a part of the driving device to apply an electrical signal, wherein the wiring and the stretchable mask pattern among the driving device and the wiring may overlap each other, in which the wiring and the stretchable mask pattern may have shapes corresponding to each other.

Advantageous Effects

According to one embodiment of the present invention, the high-stretchable region and the low-stretchable region are patterned and partitioned on the stretchable substrate through the stretchable mask pattern, so that fine patterning can be facilitated.

According to one embodiment of the present invention, the stretch mask pattern protects the high-stretchable region during process, so that high reliability can be provided.

According to one embodiment of the present invention, both of the elongation according to geometrical properties and the elongation according to the material properties are provided, so that high elasticity can be provided.

According to one embodiment of the present invention, the wiring is provided in the high-stretchable region and the driving device having lower elasticity than the wiring is provided in the low-stretchable region, so that deterioration of image quality can be minimized while having high elasticity.

According to one embodiment of the present invention, since the conventional display processes can be used, so that economic feasibility and process convenience can be improved.

According to one embodiment of the present invention, more low-stretchable regions can be provided compared to the area of the limited stretchable substrate.

According to one embodiment of the present invention, the low-stretchable region of the stretchable substrate can be provided in various shapes.

According to one embodiment of the present invention, the pixel portion having a shape corresponding to the island shape of the low-stretchable region can be provided.

According to one embodiment of the present invention, the pixel portion having an arrangement corresponding to the island shape of the low-stretchable region can be provided.

The advantageous effects of the present invention are not limited to those described above.

DESCRIPTION OF DRAWINGS

FIG. 1 is a flowchart for illustrating a method for manufacturing a stretchable substrate structure and a stretchable display according to a first embodiment of the present invention.

FIG. 2A and FIG. 2B are views for illustrating in detail steps S110 and S120 of FIG. 1.

FIG. 3 is a view for illustrating in detail step S130 of FIG. 1.

FIG. 4A and FIG. 4B are views for illustrating in detail step S140 of FIG. 1.

FIG. 5A and FIG. 5B are views for illustrating in detail step S150 of FIG. 1.

FIG. 6A, FIG. 6B and FIG. 6C are views for illustrating in detail step S160 of FIG. 1.

FIG. 7A, FIG. 7B and FIG. 7C are views for illustrating in detail step S170 of FIG. 1.

FIG. 8A, FIG. 8B are views for illustrating in detail step S180 of FIG. 1.

FIGS. 9A, 9B, 9C, 9D and 10 are views for illustrating in detail step S190 of FIG. 1.

FIG. 11A, 11B, 11C are views for illustrating a method for using a stretchable display according to a first embodiment of the present invention.

FIG. 12 is a flowchart for illustrating a method for manufacturing a stretchable substrate structure and a stretchable display according to a second embodiment of the present invention.

FIG. 13A, FIG. 13B are views for illustrating in detail step S270 of FIG. 12.

FIG. 14A, FIG. 14B are views for illustrating in detail step S280 of FIG. 12.

FIG. 15 is a view for illustrating a low stretchable region according to a first embodiment of the present invention.

FIG. 16 is a view for illustrating an arrangement of the low stretchable region of the present invention.

FIG. 17 is a view for illustrating a low stretchable region according to a second embodiment of the present invention.

FIG. 18 is a view for illustrating a low stretchable region according to a third embodiment of the present invention.

FIG. 19 is a view for illustrating a low stretchable region according to a fourth embodiment of the present invention.

FIG. 20 is a view for illustrating a pixel portion according to a first embodiment of the present invention.

FIG. 21 is a view for illustrating a pixel portion according to a modification of the first embodiment of the present invention.

FIG. 22 is a view for illustrating a pixel portion according to a second embodiment of the present invention.

FIGS. 23 and 24 are views for illustrating shapes of the pixel portion according to the embodiments of the present invention.

BEST MODE

Hereinafter, preferred embodiments of the present invention will be described in detail with reference to the accompanying drawings. However, the technical idea of the present invention is not limited to the exemplary embodiments described herein and may be embodied in other forms. Further, the embodiments disclosed thoroughly and completely herein may be provided such that the idea of the present invention can be fully understood by those skilled in the art.

Herein, when one component is mentioned as being on another component, it signifies that the one component may be placed directly on another component or a third component may be interposed therebetween. Further, in drawings, thicknesses of films and regions may be exaggerated to effectively describe the technology of the present invention.

In addition, although terms such as first, second and third are used to describe various components in various embodiments of the present specification, the components should not be limited by the terms. The above terms are used merely to distinguish one component from another. Accordingly, a first component referred to in one embodiment may be referred to as a second component in another embodiment. Each embodiment described and illustrated herein may also include a complementary embodiment. In addition, the term "and/or" is used herein to include at least one of the components listed before and after the term.

The singular expression herein includes a plural expression unless the context clearly specifies otherwise. In addition, it will be understood that the term such as "include" or "have" herein is intended to designate the presence of feature, number, step, component, or a combination thereof recited in the specification, and does not preclude the possibility of the presence or addition of one or more other features, numbers, steps, components, or combinations thereof. In addition, the term "connection" is used herein to include both indirectly connecting a plurality of components and directly connecting the components.

In addition, in the following description of the embodiments of the present invention, the detailed description of known functions and configurations incorporated herein will be omitted when it possibly makes the subject matter of the present invention unclear unnecessarily.

FIG. 1 is a flowchart for illustrating a method for manufacturing a stretchable substrate structure and a stretchable display according to a first embodiment of the present invention. FIG. 2A and FIG. 2B are views for illustrating in detail steps S110 and S120 of FIG. 1. FIG. 3 is a view for illustrating in detail step S130 of FIG. 1. FIG. 4A and FIG. 4B are views for illustrating in detail step S140 of FIG. 1. FIG. 5A and FIG. 5B are views for illustrating in detail step S150 of FIG. 1. FIG. 6A, FIG. 6B and FIG. 6C are views for illustrating in detail step S160 of FIG. 1. FIG. 7A, FIG. 7B and FIG. 7C are views for illustrating in detail step S170 of FIG. 1. FIG. 8A, FIG. 8B and are views for illustrating in detail step S180 of FIG. 1. FIGS. 9 and 10 are views for illustrating in detail step S190 of FIG. 1.

Referring to FIG. 1, the method for manufacturing a stretchable substrate structure and a stretchable display according to a first embodiment of the present invention may include at least one of a carrier substrate preparation step S110, a stretchable substrate forming step S120, a stretchable mask layer forming step S130, a stretchable mask pattern forming step S140, a hybrid stretchable substrate forming step S150, a driving device layer forming step S160, a stretchable mask pattern removing step S170, a light emitting layer forming step S180, and a carrier substrate removing step S190. For example, the stretchable substrate structure according to a first embodiment of the present invention may be manufactured by steps S110 to S150, and the stretchable display according to a first embodiment of the present invention may be manufactured by steps S110 to S190. Hereinafter, each step will be described.

Step S110

According to step S110, a carrier substrate 110 may be provided. The carrier substrate 110 may perform a function of supporting a stretchable substrate 120 so that various devices may be formed on the stretchable substrate 120 formed on an upper surface of the carrier substrate 110. To this end, the carrier substrate 110 may be formed of at least one of materials capable of providing a predetermined support force to the stretchable substrate 120, for example, glass, plastic, a metal plate, and a silicon wafer. Since the material of the carrier substrate 110 is just an example, it is not limited to the listed materials.

The carrier substrate 110 may be removed from the stretchable substrate 120 after a required device is formed on the stretchable substrate 120.

Step S120

According to step S120, the stretchable substrate 120 may be formed. The stretchable substrate 120 may provide elasticity to the stretchable display, and may function as a substrate on which various devices are formed.

To this end, the stretchable substrate 120 may include a material having elasticity, for example, an elastomer. In addition, the stretchable substrate 120 may further include a material responsive to treatment of at least one of ultraviolet ray, plasma, ion beam, neutron beam, and chemical solution, for patterning a high-stretchable region SR and a low-stretchable region RR to be described later.

The stretchable substrate 120 may be formed in various states on the carrier substrate 110. For example, as shown in FIG. 2(*a*), the stretchable substrate 120 may be formed on the carrier substrate 110 in a state of being stretched in at least one axis. For example, the stretchable substrate 120 may be formed on the carrier substrate 110 in a state of being stretched in horizontal axis and vertical axis directions. In contrast, the stretchable substrate 120 also may be formed on the carrier substrate 110 in a non-stretched state. Hereinafter, for convenience of description, it is assumed that the stretchable substrate 120 is formed on the carrier substrate 110 in a stretched state.

The stretchable substrate 120 may be formed on the carrier substrate 110 in various manners. The stretchable substrate 120 may be formed on the carrier substrate 110 to maintain adhesive strength with the carrier substrate 110 in the subsequent process and easily remove the carrier substrate 110 from the stretchable substrate 120 after completion of the process. For example, the stretchable substrate 120 may be adhered to the carrier substrate 110 through a double-sided adhesive. The double-sided adhesive may be an adhesive having adhesive strength varying according to temperature. For example, the double-sided adhesive may have a property of losing the adhesive strength at minus 30 degrees Celsius or less. When bonded to the carrier substrate 110 with the adhesive, the stretchable substrate 120 may be bonded using a roll while being stretched as shown in FIG. 2(*b*). For another example, the stretchable substrate 120 may be formed by coating on the carrier substrate 110 while being a solution state. The stretchable substrate 120 may be formed on the carrier substrate 110 while being stretched by heat treatment.

Step S130

In step S130, as shown in FIG. 3, a stretchable mask layer 130 may be formed on the stretchable substrate 120. The stretchable mask layer 130 may be formed on the stretchable substrate 120 in direct contact therewith.

The stretchable mask layer 130 may perform a function as a mask for patterning the stretchable substrate 120 into high/low-stretchable regions, a function of protecting the stretchable substrate 120 in the subsequent process, and a function of providing elasticity.

To this end, the stretchable mask layer 130 may be formed of at least one of an amorphous metal alloy and an organic barrier. The amorphous metal alloy includes any kind of alloy composed of two or more metals interrupting regular structure formation with each other, and is not limited to mentioned material examples. The amorphous metal alloy may be formed of at least one of materials, such as FeZr, CoNi, La—Al_Cu, Al—Sc, ZrTiCuNiBe, AuSi, CuZr, CuPd, CuCo, CuPdCoP, PdAgSi, PdAgSiP, PdAgSiGe, PtCuAgPBSi, CuZrTi, CuZrTiNi, and CuZrTiAlBe.

In addition, the organic barrier may be formed of at least one material of a self-assembled mono layer containing an alkylsiloxane-base or a self-assembled nano particle layer containing polystyrene-base. The barrier may be an inorganic barrier rather than the organic barrier, or may be configured as a barrier including organic and inorganic materials.

Hereinafter, for convenience of description, it is assumed that the stretchable mask layer 130 is formed of the amorphous metal alloy.

Step S140

In step S140, a stretchable mask pattern may be formed. The stretchable mask layer 130 according to step S130 may be patterned, so that a stretchable mask pattern SMP having an opening region OP and a driving region CL may be formed.

The stretchable mask layer 130 may be formed as the stretchable mask pattern SMP having the opening region OP and the driving region CL in various ways. For example, the opening region OP and the blocking region CL may be formed through a photolithography process.

As shown in FIG. 4 (a), the stretchable substrate 120 may be divided into a display region AA formed therein with a light emitting layer EL, and a peripheral region PA as a non-display region in which electric signal application wirings and driving circuit devices are formed.

A shape and a position of the opening region OP and the blocking region CL may be determined according to positions of the high-stretchable region SR and the low-stretchable region RR on the stretchable substrate 120. The low-stretchable region RR may refer to a region having a modulus greater than that of the high-stretchable region SR. Accordingly, various devices having low elasticity, for example, transistors and capacitances are formed in the low-stretchable region RR defined by the opening region OP, so that stability may be provided even in a stretching environment, and wirings having high elasticity are formed in the high-stretchable region SR defined by the blocking region CL, so that elasticity may be provided.

For example, the opening region OP may be formed to correspond to at least a part of a unit pixel of the display region AA. For example, the opening region OP may match the unit pixel. The region other than the opening region OP may be defined as the blocking region CL. Accordingly, the blocking region CL may be formed in a unit pixel, an adjacent unit pixel, and the peripheral region PA.

Due to step S140, as shown in FIG. 4(b), the stretchable substrate 120 may be exposed through the opening region OP of the stretchable mask pattern SMP, and the stretchable substrate 120 may not be exposed to the blocking region CL of the stretchable mask pattern.

The stretchable substrate 120 exposed by the opening region OP may be cured in the subsequent process, so that low-stretchable properties may be provided. The blocking region CL blocks curing of the stretchable substrate 120, so that the stretchable substrate 120 under the blocking region CL may remain as a relatively high-stretchable region. In contrast, the high-stretchable region may be formed through the opening region OP, and the low-stretchable region may be formed through the blocking region CL.

Step S150

In step S150, a hybrid stretchable substrate having both of the high-stretchable region and the low-stretchable region may be formed. In the specification herein, the hybrid stretchable substrate refers to a substrate in which a high-stretchable region and a low-stretchable region are partitioned, that is, patterned, and may also be referred to as a stretchable substrate structure.

As shown in FIGS. 5A and 5B, a curing process is performed on the stretchable substrate 120 exposed through the opening region OP of the stretchable mask pattern SMP, so that the low-stretchable region RR may be formed. For example, the curing process may include at least one of an irradiation treatment with ultraviolet ray, plasma, ion beam, or neutron beam, or a solution treatment. A modulus value of the low-stretchable region may be controlled according to the treatment of the curing process.

Meanwhile, the curing process on the stretchable substrate 120 is blocked by the stretchable mask pattern SMP, so that the high-stretchable region SR may remain as a high stretchable region compared to the low-stretchable region RR.

Since the opening region OP of the stretchable mask pattern SMP has a shape surrounded by the blocking region CL, the low-stretchable region RR may have an island shape surrounded by the high-stretchable region SR.

According to step S150, since the high-stretchable region SR and the low-stretchable region RR may be formed on the stretchable substrate 120 through the stretchable mask pattern SMP, so that fine patterning of the high-stretchable region SR and the low-stretchable regions RR can be performed.

According to one embodiment, the low-stretchable region RR may be formed through the opening region OP, in which the curing treatment may be performed such that the modulus gradually changes from a center of the low-stretchable region RR to the high-stretchable region SR. For example, a central portion of the opening region OP may be irradiated with strong plasma, and a peripheral portion of the opening region OP may be irradiated with weak plasma, so that a hybrid stretchable substrate may be manufactured in which the modulus gradually changes from the low-stretchable region RR to the high-stretchable region SR.

According to one embodiment, a difference in modulus between the low-stretchable region RR and the high-stretchable region SR may be 10 times or more.

The stretchable substrate structure may be provided by the above-described steps S110 to S150. In other words, the stretchable substrate structure according to an embodiment may include a hybrid stretchable substrate divided into a low-stretchable region RR and a high-stretchable region SR having a modulus lower than that of the low-stretchable region RR, and a stretchable mask pattern SMP having a shape corresponding to any one of the low-stretchable region RR and the high-stretchable region SR.

When the carrier substrate 110 of the stretchable substrate structure is removed, wrinkles may be formed in a thickness direction of the stretchable substrate 120 as the stretched stretchable substrate 120 is contracted, and the low-stretchable region RR may have fewer wrinkles than the high-stretchable region SR. Accordingly, the stretchable substrate 120 may have elasticity in at least one of a first axis direction and a second axis direction different from the first axis direction.

Step S160

In step S160, a driving device layer DR may be formed. The driving device layer DR may include various driving devices for driving the stretchable display. For example, the driving device layer DR may include a transistors, a capacitance, a wiring, and the like. More specifically, the driving device layer DR may include a combination of a transistor and a capacitance for controlling light emission of an organic layer, and a wiring for applying an electric signal.

Among the components forming the driving device layer DR a component having a relatively excellent elasticity, for example, the wiring may be formed in the high-stretchable region SR, and a component having relatively low elasticity, for example, the transistor and the capacitance may be formed in the low-stretchable region RR.

As shown in FIG. 6(a) and an enlarged view, the driving device layer per unit pixel may include two transistors and one capacitance. This is only an example for convenience of description, and more transistors and more capacitance may be included. In addition, the wiring may include a gate wiring for applying a gate signal to each unit pixel, a data line for applying a data signal, and an ELVDD wiring for applying a light emitting current. In other words, the two transistors and one capacitance may be formed in the low-stretchable region RR, and the wiring SL may be formed in the high-stretchable region SR.

The wiring SL may be formed of a material having a low resistance and elasticity. For example, the wiring SL may be formed of at least one material of aluminum, silver, and copper. The wiring SL may be formed of a material having the etching selectivity different from that of the above-described stretchable mask pattern SMP by at least 10 or higher. Accordingly, the wiring SL may remain unetched while the stretchable mask pattern SMP is etched. In addition, the wiring SL may have a property in which resistance is maintained within 1.5 times when stretched by 10% at most.

As described above, the wiring SL may be deposited on the highly stretchable region SR of the stretchable substrate 120. Since the stretchable mask pattern SMP is formed on the high-stretchable region SR, the wiring SL may be formed on the stretchable mask pattern SMP. The wiring SL may be formed by a photolithographic or soluble process.

The transistor constituting the driving device layer may be formed based on various types of channel layers. The channel layer may have a property of providing high mobility. For example, the transistor may include at least one of an oxide transistor using oxide as a channel layer, a low-temperature polysilicon transistor using low-temperature polysilicon as a channel layer, an organic transistor using an organic material as a channel layer, and a single crystal transistor using single crystal silicon as a channel layer. Hereinafter, for convenience of description, it is assumed the transistor is the oxide transistor.

The transistor may include a metal electrode such as a gate electrode GE, a source electrode SE, and a drain electrode DE.

In addition, the transistor may have various structures. For example, the structure of the transistor may be one of a top gate structure in which the gate electrode is positioned on an upper layer of the channel layer, a bottom gate structure in which the gate electrode is positioned on a lower layer of the channel layer, and a planar structure in which the gate electrode is on the same layer as the source/drain electrodes. Hereinafter, for convenience of description, it is assumed that the transistor has the bottom gate structure.

For the further understanding, refer to FIG. 6(b) that is a sectional view of the DRL1 in FIG. 6(a). DRL1 may refer to a transistor region connected to the data line.

Referring to FIG. 6(b), the blocking region CL of the stretchable mask pattern SMP is formed in the high stretchable region SR of the stretchable substrate 120. The wiring SL may be formed on the formed stretchable mask pattern SMP. The stretchable mask pattern SMP may prevent the high-stretchable region SR of the stretchable substrate 120 from being damaged by the wiring SL process. In other words, as described above, the stretchable mask pattern SMP functions as a mask for the stretchable partition of the stretchable substrate 120, and even functions to protect the stretchable substrate 120 during the process.

The low-stretchable region RR of the stretchable substrate 120 is exposed by the opening region OP of the stretchable mask pattern SMP. The above-described transistor may be deposited on the exposed stretchable substrate 120. For example, a film may be formed on the stretchable substrate 120 in a sequence of a gate electrode GE, a first insulating layer I1, an oxide channel layer ACT, a source electrode SE, a drain electrode DE, and a second insulating layer I2. The first and second insulating layers I1 and I2 may be formed of an organic, inorganic or organic-inorganic composite material, and may be formed of a stretchable material.

The gate electrode GE, the source electrode SE, and the drain electrode DE may be formed of the same material as that of the wiring. In contrast, the gate electrode GE, the source electrode SE, and the drain electrode DE also may be formed of a material different from that of the wiring.

According to one embodiment, the wiring SL formed in the high-stretchable region SR and the metal electrode of the transistor in the low-stretchable region RR may be electrically connected to each other. For example, the gate wiring GL formed in the high-stretchable region SR may be electrically connected to the gate electrode GE of the transistor formed in the low-stretchable region RR, and the data line DL formed in the high stretchable region SR may be electrically connected to the source electrode GE of the transistor formed in the low stretchable region RR.

Continuously refer to FIG. 6(b) for a detailed description, the wiring SL formed in the high-stretchable region SR, for example, the data line DL, and the source electrode SE of the transistor formed in the low-stretchable region RR are necessary to be electrically connected to each other, but a height difference may occur between the wiring SL and the source electrode SE since the stretchable mask pattern SMP is formed under the wiring SL. Accordingly, a through-hole may be formed in the second insulating layer I2 covering the wiring and the transistor, and an interconnector INT may be formed through the formed through-hole, so that the height difference problem may be solved.

Then, see FIG. 6(c) as a sectional view of DRL2 in FIG. 6(a). DRL2 may refer to a gate wiring region.

With reference to FIG. 6(c), the stretchable mask pattern SMP may be formed on the high-stretchable region SR, and the gate line GL may be formed on the stretchable mask pattern SMP. The second insulating layer I2 may be formed on the gate line GL. As described above, since the stretchable mask pattern SMP is formed on the high-stretchable region SR, the damage to the high-stretchable region SR may be minimized in the process of forming the gate line GL.

Meanwhile, according to one embodiment, the transistor and the capacitance of the driving device layer may also have elasticity depending on the type of material, and may have the elasticity smaller than of that of the wiring.

Step S170

In step S170, at least a part of the stretchable mask pattern may be removed. In other words, after the driving device layer forming step S160 and before the light emitting layer forming step S180, a part of the stretchable mask pattern SMP may be removed. The insulating layer on the removed stretchable mask pattern EMP may also be removed.

Referring to FIG. 7A, FIG. 7B and FIG. 7C, the stretchable mask pattern SMP exposed without being covered by the wiring in the high-stretchable region SR of the stretchable substrate 120 may be removed by a front etching scheme. Accordingly, while the stretchable mask pattern SMP under the wiring SL remains as shown in FIG. 7(b), the stretchable mask pattern SMP, which is not covered by the wiring SL, may be removed as shown in FIG. 7(c). In another aspect, the stretchable mask pattern SMP in a region overlapping the wiring SL (overlap region) may remain, and the stretchable mask pattern SMP that does not overlap the wiring SL (non-overlap region) may be removed.

The modulus may be high in a sequence of the high-stretchable region SR of the stretchable substrate 120, the stretchable mask pattern SMP overlapping the high-stretchable region SR, and the wiring SL overlapping the stretchable mask pattern SMP. For example, the modulus of the high-stretchable region SR may be 0.01 to 0.1 GPa, the modulus of the stretchable mask pattern SMP may be 1 to 10 GPa, and the modulus of the wiring SL may be 10 to 100 GPa. Accordingly, the remaining stretchable mask pattern SMP may serve as a buffer with respect to the difference in modulus between the high-stretchable region SR and the wiring SL, so that the stretchable property may be further improved.

Step S180

In step S180, the light emitting layer EL may be formed. The light emitting layer EL may include at least one layer among a hole injection layer HIL, a hole transport layer HTL, an organic layer EL, an electron transport layer ETL, and an electron injection layer EIL. The light emitting layer EL may also have elasticity. The change in image quality characteristics may be maintained at 25% or less in a state in which the light emitting layer EL is stretched by 10%.

According to one embodiment, a first pixel electrode PXE1 electrically connected to the transistor may be formed before the light emitting layer EL is formed. The first pixel electrode PXE1 may function as an anode with respect to the light emitting layer EL. The first pixel electrode PXE1 may be provided for each pixel. In addition, an organic bank for dividing pixels may be formed on the first pixel electrode PXE1. The light emitting layer EL may be formed after the organic bank is formed.

The light emitting layer EL may be formed in at least a part of the low-stretchable region RR. For example, the light emitting layer EL may be formed only in the low-stretchable region RR. In contrast, as shown in FIGS. 8(a) and 8(b), the light emitting layer EL may also be formed in at least a part of the high-stretchable region SR. To this end, the low-stretchable region RR and the high-stretchable region SR may be provided together in the unit pixel. Since the light emitting layer EL may be formed not only in the low-stretchable region RR but also in the high-stretchable region SR, a light emitting area may be increased. As the light emitting area is increased, a light emitting luminance characteristics also may be improved.

The light emitting layer EL may be formed in various ways. For example, the light emitting layer EL may be formed through a vapor deposition scheme using a shadow mask. In contrast, at least one layer of the light emitting layer EL may be transferred on the driving device layer as shown in FIG. 8(b). Since the light emitting layer EL is larger than the driving device layer, the transfer process may be available using an align process facility.

In particular, in a state in which the low-stretchable region RR and the high-stretchable region SR are mixed in a unit pixel, the process of transferring the light emitting layer may be advantageous in the case that the light emitting layer EL is also formed in the high-stretchable region SR. This is because damage applied to the exposed stretchable substrate 120 may be minimized when the light emitting layer EL is transferred, in the case that the light emitting layer EL is formed on the high-stretchable region SR of the stretchable substrate 120 exposed by removing the stretchable mask pattern SMP.

After the light emitting layer EL is formed, a second pixel electrode PXE2 in electrical contact with the light emitting layer EL may be formed. The second pixel electrode PXE2 may function as a cathode with respect to the light emitting layer EL. Unlike the first pixel electrode PXE1 provided for each pixel, the second pixel electrode PXE2 may be provided for multiple pixels. The second pixel electrode PXE2, for example, may be deposited by a sputtering process.

After the second pixel electrode PXE2 is formed, an encapsulation layer Encap may be formed. The encapsulation layer Encap may serve to block moisture and air so that moisture and the air do not permeate the light emitting layer EL. To this end, the encapsulation layer Encap may be formed of an organic-inorganic composite film containing an inorganic material and an organic material. For example, the encapsulation layer Encap may include at least one of at least one kind of carbon-based inorganic material such as graphene oxide and carbon nano tube (CNT), and an acryl-based, siloxane-based, urethane-based, or ethylene/propylene/diene-based elastomeric polymer resin film.

In the case of top emission type, the encapsulation layer Encap may be formed as a transparent layer. On the contrary, in the case of reflective emission type, the encapsulation layer Encap may be formed of a material having high reflectivity.

In describing step S180, it has been assumed that the first pixel electrode PXE1 functions as an anode, and the second pixel electrode PXE2 functions as a cathode. In contrast, the first pixel electrode PXE1 may function as a cathode, and the second pixel electrode PXE2 may function as an anode.

Step S190

In step S190, the carrier substrate 110 may be removed.

Before the carrier substrate 110 is removed, a step of forming a groove GRoove for providing a stretching path in the stretchable substrate 120 may be performed. For example, in step S120 described above, when the carrier substrate 110 is formed while the stretchable substrate 120 is stretched, the groove GR may be formed on a lower surface of the stretchable substrate 120.

The groove GR may be formed on one surface of the stretchable substrate 120, the stretching path may be provided to allow the stretchable substrate 120 to be contracted to have a predetermined shape when the stretchable substrate 120 is contracted from the stretched state.

Referring to FIG. 9A, 9B, 9C, 9D in more detail, in a state in which the driving device layer DR, the light emitting layer EL, and the encapsulation layer Encap are formed on an upper surface A1 of the stretchable substrate 120, the groove GR may be formed in a lower surface A2 of the stretchable substrate 120.

To this end, a groove pattern forming laser may be irradiated to the lower surface A2 of the stretchable substrate 120. The groove pattern forming laser may form the groove GR by decomposing a micro-region on the surface of the stretchable substrate 120.

To this end, the laser for forming the groove pattern may be selected as a beam having a property of being absorbed into the stretchable substrate 120 to form the groove GR, and passing through the carrier substrate 110 at the same time. In another aspect, the carrier substrate 110 and the double-sided tape for bonding the carrier substrate 110 to the stretchable substrate 120 may be formed of a material having high transmittance in the wavelength band of the groove pattern forming laser. The light intensity and focusing degree of the laser may be controlled according to a width and a depth of the groove GR.

The groove GR may have various shapes as shown in FIGS. 9B, 9D. Accordingly, since the groove GR may be formed in the lower surface A2 of the stretchable substrate 120, the stretching path may be provided when the stretchable substrate 120 is stretched and contracted.

The groove forming step may be performed between steps S120 and S130 described above.

After the step of forming the groove, a step of removing the carrier substrate 110 from the stretchable substrate 120 may be performed. The removal of the carrier substrate 110 may be performed in various ways. For example, a laser in the form of a line beam may be irradiated, so that the carrier substrate 110 may be separated from the stretchable substrate 120. For another example, when the carrier substrate 110 and the stretchable substrate 120 are adhered using a double-sided tape that loses adhesive strength at sub-zero 30 degrees or below, a low-temperature environment may be provided to separate the carrier substrate 110 from the stretchable substrate 120.

The stretchable substrate 120 adhering to the carrier substrate 110 in the stretched state may be removed, so that the stretchable substrate 120 may be relaxed, and accordingly, wrinkles may be formed in the stretchable substrate 120 in the direction of the groove GR.

After the carrier substrate 110 is removed from the stretchable substrate 120, subsequent processes, for example, a process of cutting the stretchable substrate 120 into a unit panel having a required size, and a module process may be performed. Meanwhile, after the stretchable substrate 120 is cut into the unit panel with the required size, the carrier substrate 110 may also be removed from the stretchable substrate 120.

Meanwhile, according to one embodiment, the method may further include step of forming a driving circuit device formed in the peripheral region PA outside the display region to apply an electric signal to the driving device layer. For example, when the driving circuit device is formed of an IC chip, the driving circuit device may be formed in the low-stretchable region RR. For another example, when the driving circuit device is formed of a stretchable film, the driving circuit device may be formed on the high-stretchable region SR. The driving circuit device may be formed before or after the carrier substrate removing step.

Accordingly, the stretchable display may be provided by the method for manufacturing the stretchable display according to steps S110 to S190.

The stretchable substrate structure according to the first embodiment of the present invention and the method for manufacturing the same, and the stretchable display and the manufacturing method thereof have been described with reference to FIGS. 1 to 10. Hereinafter, a method for using the stretchable display manufactured according to one embodiment will be described with reference to FIG. 11A, 11B, 11C.

FIG. 11A, 11B, 11C views for illustrating a method for using a stretchable display according to a first embodiment of the present invention.

The method for using the stretchable display according to an embodiment may include a first use state in which the stretchable substrate is shrunk to be wrinkled as shown in FIG. 11(a), a second use state in which the wrinkled state is unfolded and stretched compared to the first use state as shown in FIG. 11(b), and a third use state in which the material of the stretchable substrate is elongated and stretched compared to the second use state as shown in FIG. 11(c).

When the stretchable display is manufactured while the stretchable substrate 120 in the stretched state is formed on the carrier substrate 110 in step S120 of FIG. 1, and when the carrier substrate 110 is removed, the stretchable substrate 120 is contracted, so that the wrinkles may be formed as shown in FIG. 11(a). The high-stretchable region may have more wrinkles compared to the low-stretchable region.

Referring to FIG. 11(b), when a user pulls the stretchable display in the first use state in one direction, the wrinkles of the stretchable substrate 120 are unfolded, so that the second use state may be provided. In other words, the low-stretchable region RR in the second use state may become longer than the first use state by RRS1, and the high-stretchable region SR may become longer than the first use state by SRS1. Because the high-stretchable region SR has more wrinkles than the low-stretchable region RR, the stretched length SRS1 of the high-stretchable region may be longer than the stretched length RRS1 of the low-stretchable region. In other words, the wiring SL formed in the high-stretchable region SR may be stretched more than the driving device formed in the low-stretchable region RR.

Further, referring to FIG. 11(c), when the user further pulls the stretchable display in the second use state in one direction, the stretchable display may be additionally stretched according to characteristics of the material of the stretchable substrate 120. In other words, in a state in which the wrinkles of the stretchable substrate 120 are fully unfolded, the stretched length is additionally provided by the elasticity of the stretchable substrate 120. Accordingly, the low-stretchable region RR of the third use state may become longer than the second use state by RRS2, and the high-stretchable region SR may become longer than the second use state by SRS2.

According to the method for using the stretchable display according to one embodiment of the present invention described above with reference to FIG. 11A, 11B, 11C, the stretching properties may be provided as a geometric shape of the stretchable substrate is unfolded from the contracted state. In addition, the stretching properties may be further provided by the elasticity of the material itself of the stretchable substrate. Accordingly, the stretchable display can provide high-stretch according to one embodiment of the present invention.

For example, according to the first embodiment, the stretchable display may be provided to have a length elongation by at least 20% in a first axis, and have an area elongation by at least 30% in a second axis.

The method for using the stretchable display has been described according to the first embodiment of the present invention with reference to FIG. 11A, 11B, 11C. Hereinafter, a stretchable substrate structure and a stretchable display according to a second embodiment of the present invention will be described with reference to FIGS. 12 to 14.

FIG. 12 is a flowchart for illustrating a method for manufacturing a stretchable substrate structure and a stretchable display according to a second embodiment of the present invention. FIG. 13 is a view for illustrating in detail step S270 of FIG. 12. FIG. 14A, FIG. 14B are views for illustrating in detail step S280 of FIG. 12.

Referring to FIG. 12, the method for manufacturing a stretchable substrate structure and a stretchable display according to the first embodiment of the present invention may include at least one of a carrier substrate preparation step S210, a stretchable substrate forming step S220, a stretchable mask layer forming step S230, a stretchable mask pattern forming step S240, a hybrid stretchable substrate forming step S250, a driving device layer forming step S260, a light emitting layer forming step S270, a stretchable mask pattern removing step S280, and a carrier substrate removing step S290. For example, the stretchable substrate structure according to a second embodiment of the present invention may be manufactured by steps S210 to S250, and the stretchable display according to the second embodiment of the present invention may be manufactured by steps S210 to S290.

According to the first embodiment of the present invention, the stretchable mask pattern removing step is performed between the driving device layer forming step and the light emitting layer forming step. However, according to the second embodiment of the present invention, there is a difference in that the stretchable mask pattern removing step is performed after the steps of forming the driving device layer and the light emitting layer. Hereinafter, the description of the steps overlapping those of the first embodiment will be omitted, and different configurations will be mainly described.

Since steps S210 to S260 according to the second embodiment correspond to steps S110 to S160 according to the first embodiment, respectively, the detailed description will be omitted.

Step S270

In step S270, the light emitting layer forming step may be performed. In other words, the stretchable mask pattern removing step in the first embodiment is performed after the driving device layer forming step, however, the light emitting layer forming step in the second embodiment may be performed after the driving device layer forming step and before the stretchable mask pattern removing step.

The light emitting layer EL is formed on the driving device layer DR, and may be formed in a selective region so that the stretchable mask pattern SMP to be removed in the subsequent process may be continuously exposed. For example, the light emitting layer EL may be selectively formed in the low-stretchable region RR of the high-stretchable region SR and the low-stretchable region RR. Accordingly, since the stretchable mask pattern SMP of the high-stretchable region SR may be continuously exposed without being covered by the light emitting layer EL, the stretchable mask pattern may be removed in the subsequent process.

In order to selectively form the light emitting layer EL in the low-stretchable region RR, each layer constituting the light emitting layer EL may be vapor-deposited through a shadow mask in which a deposition region is opened. Accordingly, since the light emitting layer EL is formed in the low-stretchable region RR, the light emitting layer EL may be formed to be spaced apart for each pixel.

The stretchable mask pattern SMP covering the high-stretchable region SR may minimize a damage that may be applied to the high-stretchable region SR during the driving device layer forming process and the light emitting layer forming process.

Although the description is omitted, first and second pixel electrodes PXE1 and PXE2 may be formed for each pixel on lower and upper layers of the light emitting layer EL, respectively.

Further, the light emitting layer formed for each pixel may be protected by the encapsulation layer Encap spaced apart for each pixel. In other words, the encapsulation layer Encap may also cover the light emitting layer EL while being spaced apart for each pixel so as to expose the stretchable mask pattern SMP. The encapsulation layer Encap may be selected as a material having strong properties against an etching solution in the subsequent stretchable mask pattern removing process For example, the encapsulation layer may be formed of at least one of an inorganic thin film containing SiNx, SiO2, SiOxNy, Al2O3, and the like and an organic thin film containing acryl-based, siloxane-based, urethane-based, epoxy-based, imide-based polymer resin and the like.

The second pixel electrode PXE2 (not shown) and the encapsulation layer Encap may be dispensed directly with a desired patterning through a solvable process in order to minimize a damage to the light emitting layer EL upon patterning the second pixel electrode PXE2 and the encapsulation layer Encap.

According to step S270, as shown in FIG. 13(a) and FIG. 13(b) showing a section of B-B' of FIG. 13(a), the high-stretchable region SR may formed with the stretchable mask pattern SMP and wirings DL and ELVDD, in which an insulating layer may be formed on the wiring. Meanwhile, the low-stretchable region RR may be formed with the light emitting layer EL on an individual pixel including a transistor, a capacitance, and the like. Further, the encapsulation layer Encap covering the light emitting layer EL of each pixel may be formed for each pixel.

Step S280

In step S280, the stretchable mask pattern removing step may be performed.

In other words, the stretchable mask pattern SMP covering the high stretchable region SR may be removed. Since the above-described light emitting layer EL and encapsulation layer Encap are formed in the low-stretchable region RR so as to expose the stretchable mask pattern SMP covering the high-stretchable region SR, the stretchable mask pattern SMP covering the high-stretchable region SR may be removed. The stretchable mask pattern SMP is etched, so that the stretchable mask pattern SMP in a region that overlaps the wiring SL may remain, and the stretchable mask pattern SMP in a region that does not overlap the wiring SL may be removed. The insulating layer on the removed stretchable mask pattern SMP may also be removed.

After the stretchable mask pattern removing step, an auxiliary encapsulation layer Sub-Encap may be formed to cover the encapsulation layer Encap throughout the low-stretchable region RR and the high-stretchable region SR.

According to step S280, as shown in FIG. 14(a) and FIG. 14(b) showing a section of B-B' of FIG. 14(a), the high-stretchable region SR may formed with the stretchable mask pattern SMP and wirings DL and ELVDD, in which an insulating layer may be formed on the wiring. The stretchable mask pattern SMP between the wirings DL and ELVDD may be removed. Further, an auxiliary encapsulation layer Sub-Encap may be formed to cover the encapsulation layer Encap throughout the low-stretchable region RR and the high-stretchable region SR.

Since step S290 and the subsequent processes correspond to step S190 and the subsequent processes according to the first embodiment, the detailed description will be omitted.

Accordingly, the stretchable display may be provided by the method for manufacturing the stretchable display according to the second embodiment of the present invention described with reference to steps S210 to S290. The method of using the stretchable display according to a first embodiment of the present invention described with reference to FIG. 11A, 11B, 11C may also be applied to the stretchable display according to the second embodiment.

The stretchable display according to the above-described embodiments of the present invention includes a hybrid stretchable substrate 120 divided into a low-stretchable region RR and a high-stretchable region SR having a modulus lower than that of the low-stretchable region RR, a driving device layer DR including a driving device formed on the low-stretchable region RR to control the light emitting layer EL, and a wiring SL formed on the high-stretchable region SR and electrically connected to a part of the driving device to apply an electric signal, and a light emitting layer EL provided on the driving device layer DR and electrically connected to the driving device layer DR to emit light, wherein the wiring of the driving device and the wiring may be formed on the stretchable mask pattern SMP so as to overlap the stretchable mask pattern SMP.

According to some embodiments, the stretchable substrate 120 is provided on the carrier substrate 110 while being stretched, and the carrier substrate 110 is removed after the subsequent process, so that the stretchable substrate 120 may be relaxed, thereby forming wrinkles on the stretchable substrate 120 in a thickness direction. When the wrinkles are formed on the stretchable substrate 120, the stretchable substrate 120 may be formed in the wrinkled direction. Accordingly, the stretchable display according to an embodiment may provide a greater amount of elongation due to the geometrical properties as wrinkled structure and the inherent stretchable properties of each material. Accordingly, the high-stretch may be provided.

The stretchable mask pattern SMP according to the embodiments may function as a mask pattern for partitioning the stretchable substrate 120 into high and low-stretchable regions SR and RR. Accordingly, fine patterning of the high and low-stretchable regions SR and RR can be performed. In addition, the stretchable mask pattern SMP remains during the subsequent process, so that the damage applied to the high-stretchable region SR by the subsequent process may be minimized. In particular, the stretchable mask pattern SMP may protect the high-stretchable region SR even when the thickness is thin such that the stretchable substrate 120 has the elastic properties. Thus, the stretchable substrate structure and the stretchable display may be manufactured. Further, since a portion of the stretchable mask pattern SMP positioned below the wiring SL and overlapping the wiring SL remains, a difference in modulus between the stretchable substrate 120 and the wiring SL may be interfaced. Accordingly, durability may be improved even in a new environment.

In addition, according to some embodiments, because the stretchable mask pattern SMP remains below the wiring SL the height difference problem upon the electrical connection may be solved even when a height difference occurs upon electrical connection between the wiring SL and the transistor by forming a through-hole in the insulating layer covering the wiring SL and the transistor, and by forming an interconnect through the through-hole.

In addition, according to the first embodiment of the present invention, the degree of freedom in configuration may be improved in that the light emitting layer EL may be formed in the low-stretchable region RR and even in the high-stretchable region SR, since the stretchable mask pattern is removed between the driving device layer forming step and the light emitting layer forming step. Accordingly, since the light emitting area may be improved, the luminance may also be improved. In addition, even when the stretchable mask pattern SMP is removed before the light emitting layer forming step, the damage to the high-stretchable region SR exposed by removing the stretchable mask pattern SMP may be minimized when the light emitting layer EL is transferred. In particular, since the light emitting layer EL may be allowed to have a patterning accuracy relatively lower than that of the driving device layer, the transfer process can be easily performed.

In addition, according to the second embodiment of the present invention, since the stretchable mask pattern removing step is performed after the driving device layer forming step and the light emitting layer forming step, a damage applied to the high-stretchable region SR may be minimized when the driving device layer DR and the light emitting layer EL are formed, and further, when the upper pixel electrode PXE2 and the encapsulation layer Encap are formed.

The description of the embodiments of the present invention is not limited, and the embodiments of the present invention may be applied to a top emission stretchable display or a bottom emission stretchable display.

Hereinafter, the sizes and shapes of the high-stretchable region SR and the low-stretchable region RR of the stretchable substrate structure and the stretchable display, and the arrangement of the pixel portion FR will be described.

FIG. 15 is a view for illustrating a low stretchable region according to the first embodiment of the present invention. FIG. 16 is a view for illustrating an arrangement of the low stretchable region. FIG. 17 is a view for illustrating a low stretchable region according to the second embodiment of the present invention. $$FIG. 18 is a view for illustrating a low stretchable region according to a third embodiment of the present invention. FIG. 19 is a view for illustrating a low stretchable region according to a fourth embodiment of the present invention. FIG. 20 is a view for illustrating a pixel portion according to the first embodiment of the present invention. FIG. 21 is a view for illustrating a pixel portion according to a modification of the first embodiment of the present invention. FIG. 22 is a view for illustrating a pixel portion according to the second embodiment of the present invention. FIGS. 23 and 24 are views for illustrating shapes of the pixel portion according to the embodiments of the present invention.

Referring to FIGS. 15 to 24, the stretchable display according to the embodiments of the present invention may include a stretchable substrate 120 divided into a pad region PR and a display region DPR provided in the pad region PR.

According to one embodiment, the stretchable substrate 120 may be divided into a high stretchable region SR and a low stretchable region RR having a modulus higher than that of the high stretchable region SR.

In the regions dividing the stretchable substrate 120, the pad region PR may be divided as the high-stretchable region SR. Meanwhile, in the regions dividing the stretchable substrate 120, the display region DPR may be divided as the low-stretchable region RR and the high-stretchable region SR.

More specifically, the low-stretchable region RR may have a shape of a plurality of islands spaced apart from each other. In addition, the high-stretchable region SR may surround the low-stretchable region RR having the island shape.

Hereinafter, the stretchable substrate 120 described later with reference to FIGS. 15 to 24 may also be manufactured by the method for manufacturing the stretchable substrate previously described with reference to FIGS. 1 to 14.

Hereinafter, specific embodiments and modifications thereof will be described in more detail with reference to FIGS. 15 to 24.

The embodiments and modifications to be described below are merely examples, the present invention is not limited thereto, and the embodiments and modifications described below may be combined.

Referring to FIG. 15, the island shape of the low-stretchable region RR1 according to a first embodiment of the present invention may have a circular shape. According to one embodiment, the low-stretchable region RR1 may be arranged in a plurality of rows and a plurality of columns in a plane direction of the stretchable substrate 120.

For example, as shown in FIG. 16(a), the low-stretchable region RR1 may be arranged side by side in the row direction LD or column direction RD.

Alternatively, for another example as shown in FIG. 16(b), the low-stretchable region RR1 may be arranged in a zigzag in the row direction LD or column direction RD.

In the above-described first embodiment, the low-stretchable region arranged in the row direction LD or column direction RD may also be applied to the second to fourth embodiments to be described later.

Alternatively, according to the second to fourth embodiments of the present invention, the islands of the low-stretchable regions RR2 to RR4 may have polygonal shapes.

More specifically, as shown in FIG. 17, the island of the low-stretchable region RR2 may have a quadrangular shape. Alternatively, as shown in FIG. 18, the island of the low-stretchable region RR3 may have a hexagonal shape. Alternatively, as shown in FIG. 19, the island of the low-stretchable region RR4 may have a triangular shape.

As described above the types of the polygons described according to the embodiments of the present invention merely are examples, and are not limited to the above-described rectangle, hexagon, or triangle.

According to the above-described second to fourth embodiments of the present invention, when the low-stretchable regions RR2 to RR4 have the polygonal island shapes, the low-stretchable regions RR2 to RR4 may be arranged so that adjacent hypotenuses of the polygons forming the low-stretchable regions RR2 to RR4 face each other, as shown in FIGS. 17 to 19.

In particular, according to the fourth embodiment of the present invention, when the low-stretchable region RR4 has the triangular island shape as shown in FIG. 19, the low-stretchable region RR4 may be arranged so that adjacent hypotenuses of the polygons forming the low-stretchable region RR2 faces each other.

Accordingly, more low-stretchable regions RR2 to RR4 may be provided compared to the area of the limited stretchable substrate 120.

According to the embodiment of the present invention, the pixel portion FR may be provided in the low-stretchable region RR as described above with reference to FIGS. 1 to 14. More specifically, the pixel portion FR may also include a light emitting layer EL provided in each of the island-shaped low-stretchable regions RR to emit a specific color, and a driving device layer DR for controlling a driving of the light emitting layer EL.

Hereinafter, the pixel portion FR according to the embodiments of the present invention will be described with reference to FIGS. 20 to 24.

Referring to FIG. 20, the pixel portion FR1 according to a first embodiment of the present invention may include a combination of red R, green G, and blue B as one unit (that is, 1 set of RGB).

More specifically, the pixel portion FR1 according to a first embodiment of the present invention may be arranged in each island-shaped low-stretchable region RR1 as the one set of RGB.

Alternatively, referring to FIG. 21, the pixel portion FR1 according to a modification of the first embodiment of the present invention may be configured such that a plurality of RGB sets of RGB (FR1-1, FR1-2 etc.,) may be arranged in each island-shaped low-stretchable region RR1.

Alternatively, referring to FIG. 22, the pixel portion FR2 according to the second embodiment of the present invention may include a combination of red R, green G, blue B, and white W as one unit (that is, 1 set of RGBW).

More specifically, the pixel portion FR2 according to the second embodiment may be arranged in each island-shaped low-stretchable region RR1 as the one set of RGBW.

Alternatively, according to the above-described modifications of the present invention, the pixel portion FR1 according to the modification of the first embodiment of the present invention may be configured such that a plurality of sets of RGBW (FR1-1, FR1-2 etc.,) may be arranged in each island-shaped low-stretchable region RR1.

According to one embodiment, each of the pixel portions FR arranged in the individual island-shaped low-stretchable region RR may have a shape corresponding to the island shape of the low-stretchable region RR.

For example, referring to FIG. 23, when the island shape of the low-stretchable region RR4 is a triangle according to the embodiment of the present invention, and when the pixel portion FR1 includes the combination of red R, green G, and blue B as one unit (that is, RGB 1 set) according to the embodiments of the present invention, each of the red R, green G, and blue B arranged in the low-stretchable region RR4 may have a triangular shape according to the triangular shape of the low-stretchable region RR4.

Alternatively, for another example, when the island shape of the low-stretchable region RR4 is a triangle according to the embodiment of the present invention, and when the pixel portion FR1 when a plurality of pixel portions are arranged with combinations of the red R, green G, and blue B as one unit (that is, RGB 1 set) according to the embodiments of the present invention, each unit of the pixels arranged in the low-stretchable region RR4 may have a triangular shape according to the triangular shape of the low-stretchable region RR4.

Alternatively, referring to FIG. 24, when the island shape of the low-stretchable region RR4 is a triangle according to the embodiment of the present invention, and when the pixel portion FR2 includes a combination of red R, green G, blue B, and white W as one unit (that is, RGBW 1 set) according to the embodiments of the present invention, each of red R, green G, blue B, and white W arranged in the low-stretch region RR4 may have a triangular shape according to the triangular shape of the low-stretchable region RR4.

For another example, when the island shape of the low-stretchable region RR4 is a triangle according to the embodiment of the present invention, and when the pixel portion FR2 includes a plurality of combinations of red (R), green (G), blue (B), and white (W) arranged as one unit (that is, RGBW 1 set) according to the embodiments of the present invention, each unit of the pixels arranged in the low-stretchable region RR4 may have a triangular shape according to the triangular shape of the low-stretchable region RR4.

In addition, according to one embodiment, the pixel units FR arranged in the individual island-shaped low-stretchable regions RR may be arranged in an arrangement corresponding to the island shape of the low-stretchable region RR.

For example, when the island shape of the low-stretchable region RR1 is circular as described above with reference to FIG. 15, the pixel portions may be arranged according to the circular shape of the low-stretchable region RR1 even when the pixel portions FR1-1, FR1-2, etc., have a rectangular shape rather than a circular shape as shown in FIG. 21.

For another example, when the island shape of the low-stretchable region RR2 is rectangular as described above with reference to FIG. 17, the pixel portions may be disposed according to the rectangular shape of the low-stretchable region RR2 even when the pixel portions FR1-1, FR1-2, etc., are not in a rectangular shape.

For another example, when the island shape of the low-stretchable region RR3 is hexagonal as described above with reference to FIG. 18 or the island shape of the low-stretchable region RR4 is triangular as described above with reference to FIG. 19, the pixel portions may be arrange according to the hexagonal shape of the low-stretchable region RR3 or the triangular shape of the low-stretchable region RR4 even when the pixel portions FR1-1, FR1-2, etc., are not in a polygonal or rectangular shape.

The size and shape of the high-stretchable region SR and the low-stretchable region RR of the stretchable substrate structure and the stretchable display, and the arrangement of the pixel portion FR have been described.

The stretchable substrate 120 may have wrinkles even in the above-described embodiments and modifications. More specifically, the low-stretchable region RR of the stretchable substrate 120 may have wrinkles fewer than the high-stretchable region SR.

In addition, even the above-described embodiments and modifications may also include the stretchable mask pattern SMP. More specifically, the stretchable mask pattern SMP may partition the stretchable low-stretchable region RR and the high-stretchable region SR, and may be provided on any one of the low-stretchable region RR and the high-stretchable region SR.

In addition, the driving device layer may include a driving device formed on the low-stretchable region RR to control the light emitting layer EL, and a wiring SL formed on the high-stretchable region SR and electrically connected to a part of the driving device to apply an electric signal.

Among the driving device and the wiring, the wiring SL and the stretchable mask pattern SMP overlap each other, in which the wiring SL and the stretchable mask pattern SMP may have shapes corresponding to each other.

Although the present invention has been described in detail with reference to the preferred embodiments, the present invention is not limited to the specific embodiments and shall be interpreted by the following claims. In addition, it will be apparent that a person having ordinary skill in the art may carry out various deformations and modifications for the embodiments described as above within the scope without departing from the present invention.

The invention claimed is:

1. A stretchable display comprising:
    a stretchable substrate partitioned into a high-stretchable region and, a low-stretchable region having a shape of a plurality of islands spaced apart from each other and a modulus higher than a modulus of the high-stretchable region;
    a plurality of pixel portions provided in each island-shaped low-stretchable region, and including a light emitting layer for emitting a specific color and a driving device for controlling a driving of the light emitting layer; and
    a stretchable mask pattern partitioning the low-stretchable region and the high-stretchable region, and provided on any one of the low-stretchable region and the high-stretchable region,
    wherein the stretchable substrate comprises a stretchable material that is partitioned into the high-stretchable region and the low-stretchable region,
    wherein the high-stretchable region surrounds the island-shaped low-stretchable region, wherein the modulus gradually changes from a center of the low-stretchable region to the high-stretchable region,
    wherein the stretchable substrate has wrinkles, and the low-stretchable region has fewer wrinkles than the high-stretchable region,
    wherein the driving device is formed on the low-stretchable region to control the light emitting layer, and a wiring is formed on the high-stretchable region and electrically connected to a part of the driving device to apply an electrical signal,
    wherein the wiring and the stretchable mask pattern overlap each other, and the wiring and the stretchable mask pattern have shapes corresponding to each other,
    wherein the wiring is formed on the stretchable mask pattern, and
    wherein the modulus of the high-stretchable region of the stretchable substrate is greater than a modulus of the stretchable mask pattern overlapping the high-stretchable region, the modulus of the stretchable mask pattern being greater than a modulus of the wiring overlapping the stretchable mask pattern.

2. The stretchable display of claim 1, wherein the island shape of the low-stretchable region includes a circle or polygon.

3. The stretchable display of claim 1, wherein the low-stretchable region is arranged as a plurality of rows and a plurality of columns in a plane direction of the stretchable substrate, in which the low-stretchable region is arranged in a zigzag in a row direction or column direction.

4. The stretchable display of claim 2, wherein, when the island shape of the low-stretchable region is the polygon, the low-stretchable region is arranged such that adjacent hypotenuses of the polygons forming the low-stretchable region face each other.

5. The stretchable display of claim 4, wherein, when the island shape of the low-stretchable region is the triangle, the low-stretchable region is arranged so that adjacent hypotenuses of the triangles forming the low-stretchable region face each other.

6. The stretchable display of claim 1, wherein the pixel portions arranged in each island-shaped low-stretchable region include a combination of red (R), green (G), and blue (B) or a combination of red (R), green (G), blue (B), and white (W).

7. The stretchable display of claim 6, wherein each of the pixel portions arranged in each island-shaped low-stretchable region has a shape corresponding to the island shape of the low-stretchable region, or the pixel portions arranged in each island-shaped low-stretchable region are arranged in an arrangement corresponding to the island shape of the low-stretchable region.

* * * * *